(12) United States Patent
Fukuzawa et al.

(10) Patent No.: US 7,525,776 B2
(45) Date of Patent: Apr. 28, 2009

(54) MAGNETORESISTIVE ELEMENT, MAGNETORESISTIVE HEAD, MAGNETIC RECORDING APPARATUS, AND MAGNETIC MEMORY

(75) Inventors: Hideaki Fukuzawa, Kawasaki (JP); Hiromi Yuasa, Kawasaki (JP); Katsuhiko Koui, Ome (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 306 days.

(21) Appl. No.: 11/269,878

(22) Filed: Nov. 9, 2005

(65) Prior Publication Data

US 2006/0098353 A1    May 11, 2006

(30) Foreign Application Priority Data

Nov. 9, 2004    (JP) .............................. 2004-325315

(51) Int. Cl.
    *G11B 5/39*    (2006.01)
(52) U.S. Cl. .............................. 360/324.12; 360/324.11; 360/324.2
(58) Field of Classification Search ....... 360/324–324.2
    See application file for complete search history.

(56) References Cited

U.S. PATENT DOCUMENTS

| | | | |
|---|---|---|---|
| 5,608,593 A | 3/1997 | Kim et al. | |
| 6,080,445 A | 6/2000 | Sugiyama et al. | |
| 6,169,303 B1 * | 1/2001 | Anthony | 257/295 |
| 6,313,973 B1 | 11/2001 | Fuke et al. | |
| 6,411,476 B1 | 6/2002 | Lin et al. | |
| 6,452,763 B1 | 9/2002 | Gill | |
| 6,511,855 B2 * | 1/2003 | Anthony | 438/3 |
| 6,686,068 B2 * | 2/2004 | Carey et al. | 428/811.3 |
| 6,707,649 B2 * | 3/2004 | Hasegawa et al. | 360/324.12 |
| 6,775,111 B2 | 8/2004 | Lin et al. | |

(Continued)

FOREIGN PATENT DOCUMENTS

CH    1419232    5/2003

(Continued)

OTHER PUBLICATIONS

Fukuzawa et al., "MR Ratio Enhancement by NOL Current-Confined-Path Structures in CPP Spin Valves", IEEE Transactions on Magnetics, vol. 40, No. 4, Jul. 2004.

(Continued)

*Primary Examiner*—William J Klimowicz
(74) *Attorney, Agent, or Firm*—Nixon & Vanderhye, PC

(57) ABSTRACT

A magnetoresistive element has a magnetization pinned layer a magnetization direction of which is substantially pinned in one direction, a magnetization free layer a magnetization direction of which varies depending on an external field, and a spacer layer including an insulating layer provided between the magnetization pinned layer and the magnetization free layer and current paths penetrating the insulating layer, the magnetization pinned layer or magnetization free layer located under the spacer layer comprising crystal grains separated by grain boundaries extending across a thickness thereof, in which, supposing that an in-plane position of one end of each of the crystal grains is set to 0 and an in-plane position of a grain boundary adjacent to the other end of the crystal grain is set to 100, the current path corresponding the crystal grain is formed on a region in a range between 20 and 80 of the in-plane position.

19 Claims, 15 Drawing Sheets

U.S. PATENT DOCUMENTS

| | | |
|---|---|---|
| 6,784,509 B2 | 8/2004 | Yuasa et al. |
| 6,785,103 B2 | 8/2004 | Cornwell et al. |
| 6,788,499 B2 | 9/2004 | Lin et al. |
| 6,833,981 B2 | 12/2004 | Suwabe et al. |
| 6,927,952 B2 | 8/2005 | Shimizu et al. |
| 6,937,447 B2 | 8/2005 | Okuno et al. |
| 6,961,224 B2 | 11/2005 | Pinarbasi |
| 7,002,781 B2 * | 2/2006 | Sugawara ............... 360/324.11 |
| 7,071,522 B2 | 7/2006 | Yuasa et al. |
| 7,116,529 B2 | 10/2006 | Yoshikawa et al. |
| 7,180,714 B2 | 2/2007 | Gill |
| 7,221,545 B2 | 5/2007 | Gill |
| 7,223,485 B2 | 5/2007 | Yuasa et al. |
| 7,331,100 B2 | 2/2008 | Li et al. |
| 7,336,453 B2 * | 2/2008 | Hasegawa et al. ...... 360/324.12 |
| 7,379,278 B2 | 5/2008 | Koui et al. |
| 7,390,529 B2 | 6/2008 | Li et al. |
| 7,426,098 B2 | 9/2008 | Yuasa et al. |
| 7,443,004 B2 | 10/2008 | Yuasa et al. |
| 2002/0048127 A1 | 4/2002 | Fukuzawa et al. |
| 2002/0048128 A1 | 4/2002 | Kamiguchi et al. |
| 2002/0051380 A1 | 5/2002 | Kamiguchi et al. |
| 2002/0150791 A1 | 10/2002 | Yuasa et al. |
| 2002/0151791 A1 | 10/2002 | Nozaki et al. |
| 2003/0123200 A1 | 7/2003 | Nagasaka et al. |
| 2003/0128481 A1 | 7/2003 | Seyama et al. |
| 2004/0021990 A1 | 2/2004 | Koui et al. |
| 2005/0168887 A1 | 8/2005 | Yuasa et al. |
| 2006/0034022 A1 | 2/2006 | Fukuzawa et al. |
| 2006/0050444 A1 | 3/2006 | Fukuzawa et al. |
| 2006/0077596 A1 * | 4/2006 | Yuasa et al. ............... 360/324.1 |
| 2006/0181814 A1 | 8/2006 | Koui et al. |
| 2007/0014054 A1 * | 1/2007 | Zhang et al. ........... 360/324.12 |
| 2007/0223150 A1 * | 9/2007 | Fukuzawa et al. ...... 360/324.11 |

FOREIGN PATENT DOCUMENTS

| | | |
|---|---|---|
| CH | 1431651 | 7/2003 |
| JP | 11-86229 | 3/1999 |
| JP | 2002-76473 | 3/2002 |
| JP | 2002-208744 | 7/2002 |
| JP | 2003-60263 | 2/2003 |
| JP | 2004-153248 | 5/2004 |

OTHER PUBLICATIONS

Fukuzawa et al., "Nanoconstricted structure for current-confined path in current-perpendicular-to-plane spin valves with high magnetoresistance", Journal of Applied Physics 97, 10C509, 2005.

M. Takagishi, et al., "The Applicability of CPP-GMR heads for Magnetic Recording", IEEE Transactions on Magnetics, vol. 38, No. 5, Sep. 2002; pp. 2277-2282.

K. Nagasaka et al., "Giant magnetroresistance properties of specular spin valve films in a current perpendicular to plane structure", Journal of Applied Physics, vol. 89, No. 11, Jun. 1, 2001, pp. 6943-6345.

H. Yuasa et al., "Output enhancement of spin-valve giant mabnetoresistance in current-perpendicular-to-plane geometry", Journal of Applied Physics, vol. 92, No. 5, Spe. 1, 2002, pp. 2646-2650.

Hideaki Fukuzawa, et al., "MR Ratio Enhancement by NOL Current Confined-Path Structures in CPP Spin Valaves", IEEE Transactions on Magnetics, vol. 40, No. 4, Jul. 2004, pp. 2236-2238.

* cited by examiner

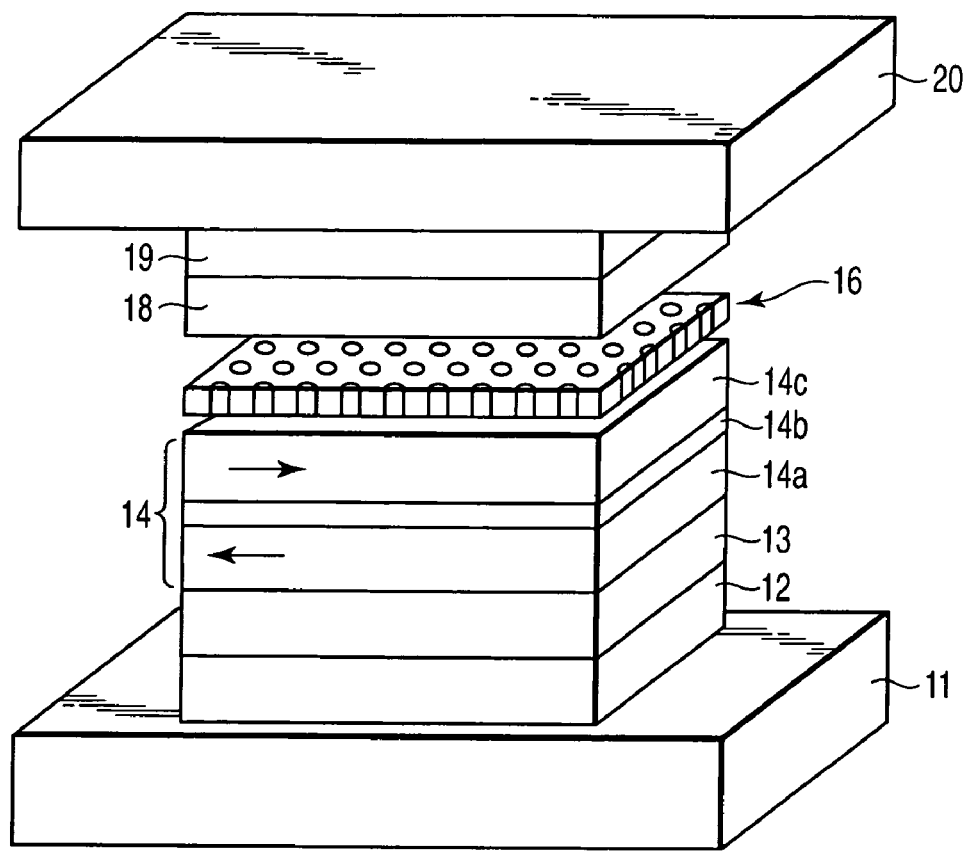
F I G. 1A
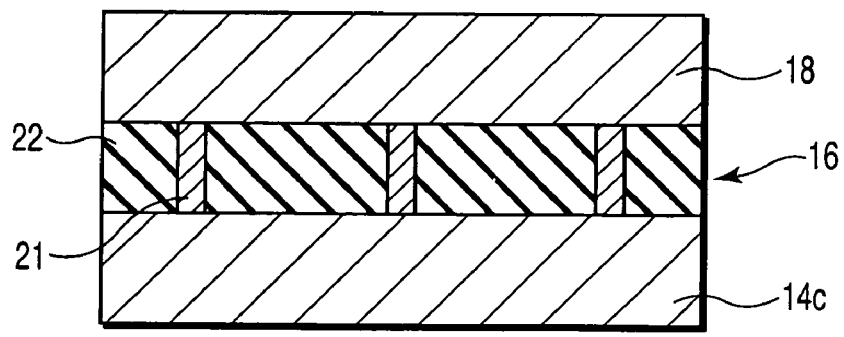
F I G. 1B

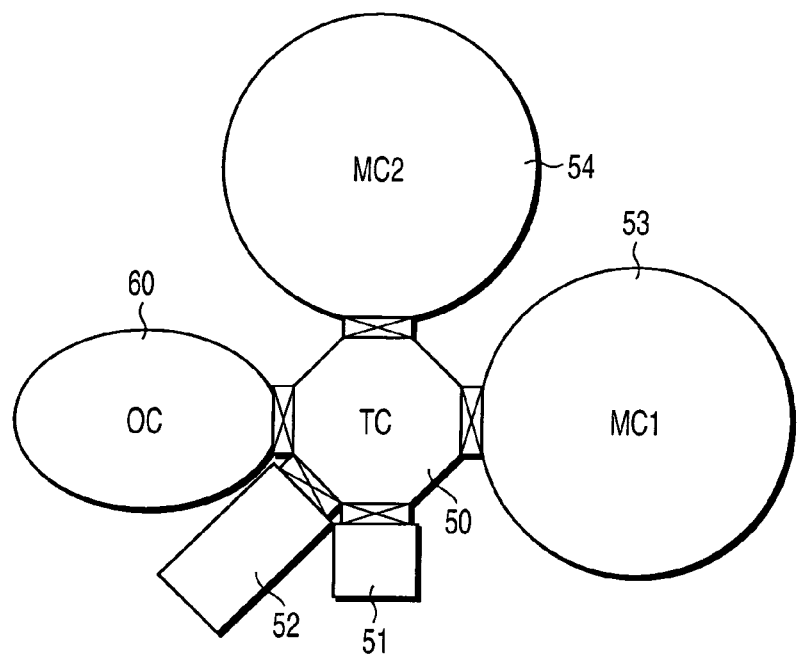
F I G. 3
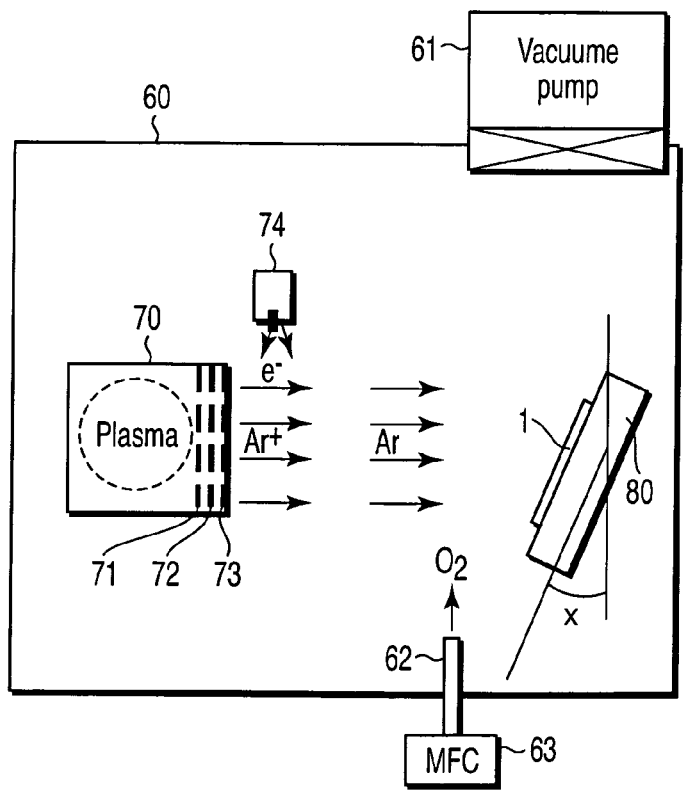
F I G. 4

5 degrees or less

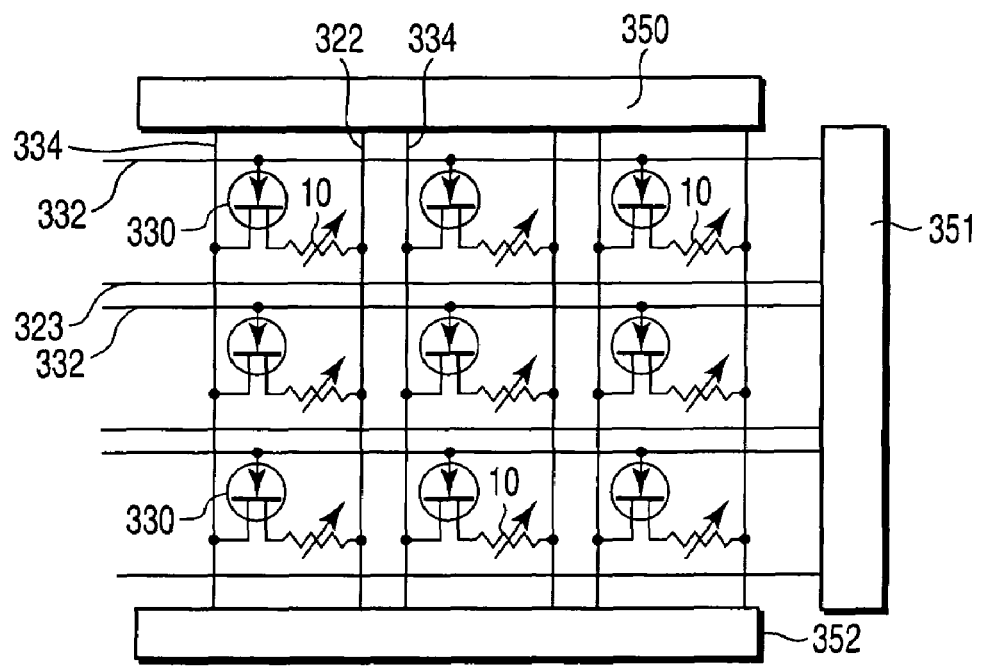
F I G. 19
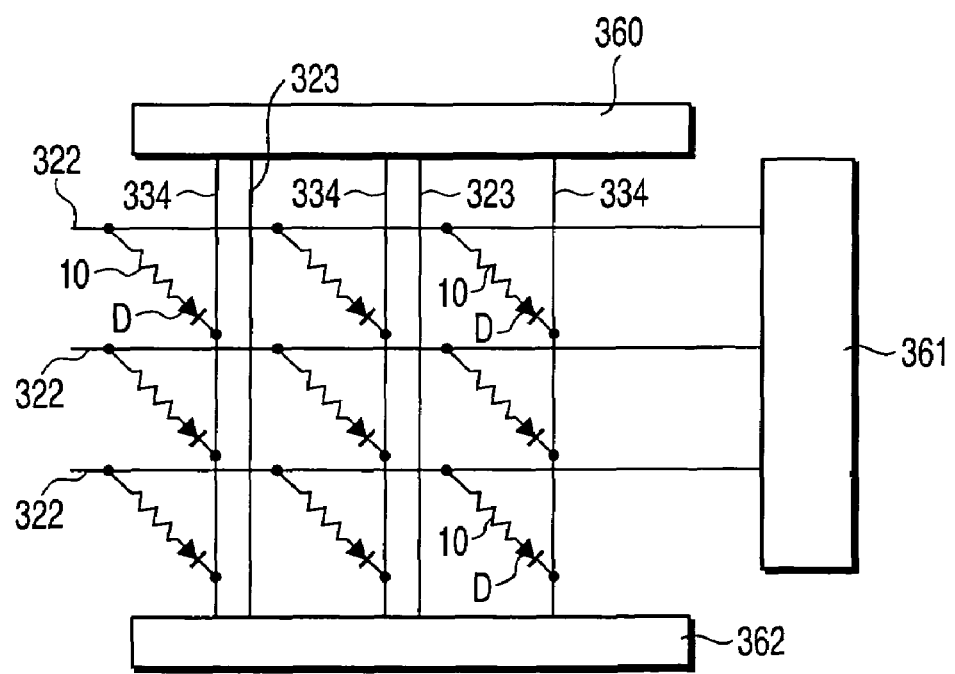
F I G. 20

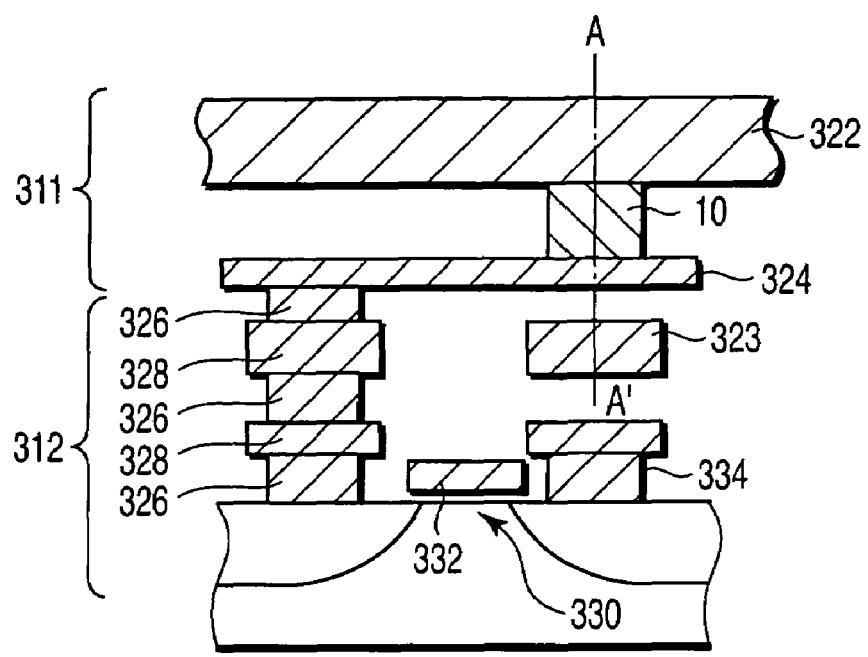
F I G. 21
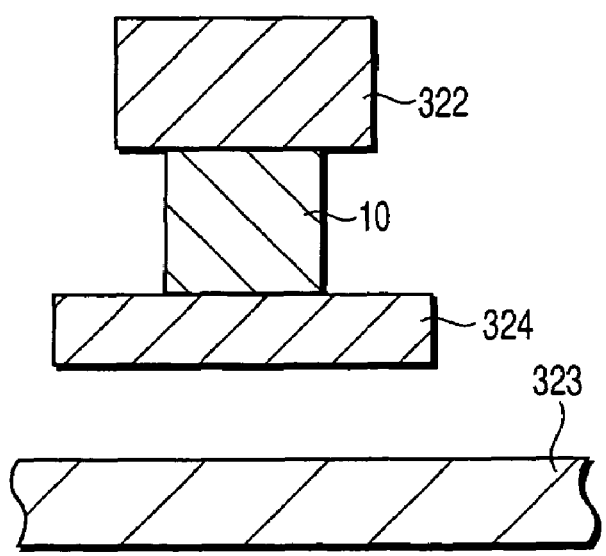
F I G. 22

MAGNETORESISTIVE ELEMENT, MAGNETORESISTIVE HEAD, MAGNETIC RECORDING APPARATUS, AND MAGNETIC MEMORY

CROSS-REFERENCE TO RELATED APPLICATIONS

This application is based upon and claims the benefit of priority from prior Japanese Patent Application No. 2004-325315, filed Nov. 9, 2004, the entire contents of which are incorporated herein by reference.

BACKGROUND OF THE INVENTION

1. Field of the Invention

The present invention relates to a magnetoresistive element having a structure in which a sense current is allowed to flow perpendicularly to a plane of a magnetoresistive film, and a magnetoresistive head, a magnetic recording apparatus, and a magnetic memory which use the magnetoresistive element.

2. Description of the Related Art

In recent years, the discovery of a giant magnetoresistive effect (GMR) has rapidly improved the performance of magnetic devices, particularly magnetic heads. In particular, the application of the spin-valve films (SV films) to magnetic heads in or magnetic random access memories (MRAMs) has brought about significant technical improvement in magnetic devices.

The "spin-valve film" is a stacked film having the structure in which a nonmagnetic metal spacer layer is sandwiched between two ferromagnetic layers. In the spin-valve film, the magnetization of one ferromagnetic layer (referred to as a "pinned layer" or "magnetization pinned layer") is pinned by an antiferromagnetic layer or the like, whereas the magnetization of the other ferromagnetic layer (referred to as a "free layer" or "magnetization free layer") is capable of rotating according to an external field (for example, a media field). In the spin-valve film, a giant magnetoresistance change can be produced by a change of the relative angle between the magnetization directions of the pinned layer and the free layer.

In recent years, much attention has been paid to current-perpendicular-to-plane (CPP)-GMR elements in which a sense current is supplied substantially perpendicular to the plane of the element because the CPP-GMR elements exhibit a greater GMR effect than the current-in-plane (CIP)-GMR elements. When such a magnetoresistive element is applied to a magnetic head, a higher element resistance poses problems in regard to shot noise and high frequency response. It is appropriate to evaluate the element resistance in terms of RA (an area resistance product). Specifically, RA must be several hundred m$\Omega\mu m^2$ to 1 $\Omega\mu m^2$ at a recording density of 200 Gbpsi (gigabits per square inch) and less than 500 m$\Omega\mu m^2$ at a recording density of 500 Gbpsi.

In connection with these requirements on the trend of increasingly reducing the size of the magnetic device, the CPP element has a potential to provide a high MR ratio even though it exhibits a low resistance. Under the circumstances, the CPP element and the magnetic head using the same are expected to be promising candidates to achieve a recording density of 200 Gbpsi to 1 Tbpsi (terabits per square inch).

However, a metal CPP element in which the pinned layer, the spacer layer and the free layer (this three-layer structure is referred to as a spin-dependent scattering unit) are made of metal exhibits only a low resistance change. Accordingly, the metal CCP element is insufficient to sense very weak fields resulting from an increased density and thus hard to put to, practical use.

To solve this problem, a CPP element has been proposed which uses, as a nonmagnetic spacer layer, a nano-oxide layer (NOL) containing current paths extending across the thickness of the element (see, for example, Jpn. Pat. Appln. KOKAI Publication No. 2002-208744). Such a CPP element can increase both the element resistance and the MR ratio due to a current-confined-path (CCP) effect. Such an element is referred to as a CCP-CPP element hereinafter. Incidentally, a method for forming a layer mainly composed of an oxide in a magnetoresistive element has already been proposed (see Jpn. Pat. Appln. KOKAI Publication No. 2002-76473).

Compared to the metal CPP element, the CCP-CPP element has the following improvement effect. A metal CPP element was produced which had the structure of substrate/Ta [5 nm]/Ru [2 nm]/PtMn [15 nm]/$Co_{90}Fe_{10}$ [4 nm]/Ru [0.9 nm]/$Co_{90}Fe_{10}$ [4 nm]/Cu [5 nm]/$Co_{90}Fe_{10}$ [1 nm]/$Ni_{81}Fe_{19}$ [3 nm]/Cu [1 nm]/Ta cap layer. Ordering heat treatment for pinning the pinned layer by PtMn was carried out in a magnetic field at 270° C. for 10 hours. On the other hand, a CCP-CPP element having a NOL formed as a spacer layer by naturally oxidizing $Al_{90}Cu_{10}$ [0.7 nm], instead of the Cu spacer layer in the metal CPP element, was produced. The area resistance product RA, the change of the area resistance product $\Delta RA$, and the MR ratio of these elements are shown below.

|  | Metal CPP | CCP-CPP |
|---|---|---|
| Area resistance product RA | 100 m$\Omega\mu m^2$ | 370 m$\Omega\mu m^2$ |
| Change of area resistance product $\Delta RA$ | 0.5 m$\Omega\mu m^2$ | 5.6 m$\Omega\mu m^2$ |
| MR ratio | 0.5% | 1.5% |

As described above, the CCP-CPP element exhibits an improved MR ratio and an improved RA, and thus, has $\Delta RA$ higher than that of the metal CPP element by about one order of magnitude.

However, in spite of their good characteristics shown above, the CCP-CPP element is supposed insufficient to sense very weak field signals from a media with a high recording density of 200 to 500 Gbpsi. A trial calculation indicates that the MR ratio must be at least 3% at, for example, a recording density of 200 Gbpsi and RA of 500 m$\Omega\mu m^2$. In order to ensure a sufficient signal-to-noise ratio, it is necessary to provide an MR ratio of at least 7%, that is, at least double the trial calculation. In view of the criterion, the above value of the MR ratio is about half, or less than a quarter compared to the required specification. Thus, it is difficult to put these elements to practical use.

BRIEF SUMMARY OF THE INVENTION

A magnetoresistive element according to an aspect of the present invention comprises: a magnetization pinned layer a magnetization direction of which is substantially pinned in one direction; a magnetization free layer a magnetization direction of which varies depending on an external field; and a spacer layer including an insulating layer provided between the magnetization pinned layer and the magnetization free layer and current paths penetrating the insulating layer, the magnetization pinned layer or magnetization free layer located under the spacer layer comprising crystal grains separated by grain boundaries extending across a thickness thereof, wherein, supposing that an in-plane position of one end of each of the crystal grains is set to 0 and an in-plane position of a grain boundary adjacent to the other end of the crystal grain is set to 100, the current path corresponding to each crystal grain is formed on a region of the crystal grain in a range between 20 and 80 of the in-plane position.

A magnetoresistive element according to another aspect of the present invention comprises: a magnetization pinned layer a magnetization direction of which is substantially pinned in one direction; a magnetization free layer a magnetization direction of which varies depending on an external field; and a spacer layer including an insulating layer provided between the magnetization pinned layer and the magnetization free layer and current paths penetrating the insulating layer, the magnetization pinned layer or magnetization free layer located under the spacer layer comprising crystal grains separated by grain boundaries extending across a thickness thereof, wherein each of the current paths is formed on a region at least 3 nm away from ends of each of the crystal grains contained in the magnetization pinned layer or magnetization free layer located under the spacer layer.

A magnetoresistive element according to still another aspect of the present invention comprises: a magnetization pinned layer a magnetization direction of which is substantially pinned in one direction; a magnetization free layer a magnetization direction of which varies depending on an external field; and a spacer layer including an insulating layer provided between the magnetization pinned layer and the magnetization free layer and current paths penetrating the insulating layer, wherein dispersion of a crystal orientation angle of each of the current paths is at most 5°.

BRIEF DESCRIPTION OF THE SEVERAL VIEWS OF THE DRAWING

FIGS. 1A and 1B are a perspective view and a cross-sectional view of a magnetoresistive element according to an embodiment of the present invention;

FIG. 3 is a schematic diagram showing a deposition apparatus used to manufacture a magnetoresistive element according to the embodiment of the present invention;

FIG. 4 is a diagram showing the configuration of an oxidation chamber in the deposition apparatus shown in FIG. 3;

FIG. 19 is a diagram showing an example of the matrix configuration of a magnetic memory according to an embodiment of the present invention;

FIG. 20 is a diagram showing another example of the matrix configuration of a magnetic memory according to an embodiment of the present invention;

FIG. 21 is a cross-sectional view showing a major portion of a magnetic memory according to an embodiment of the present invention; and FIG. 22 is a cross-sectional view of the magnetic memory taken along the line A-A' in FIG. 21.

DETAILED DESCRIPTION OF THE INVENTION

Figure 2A:
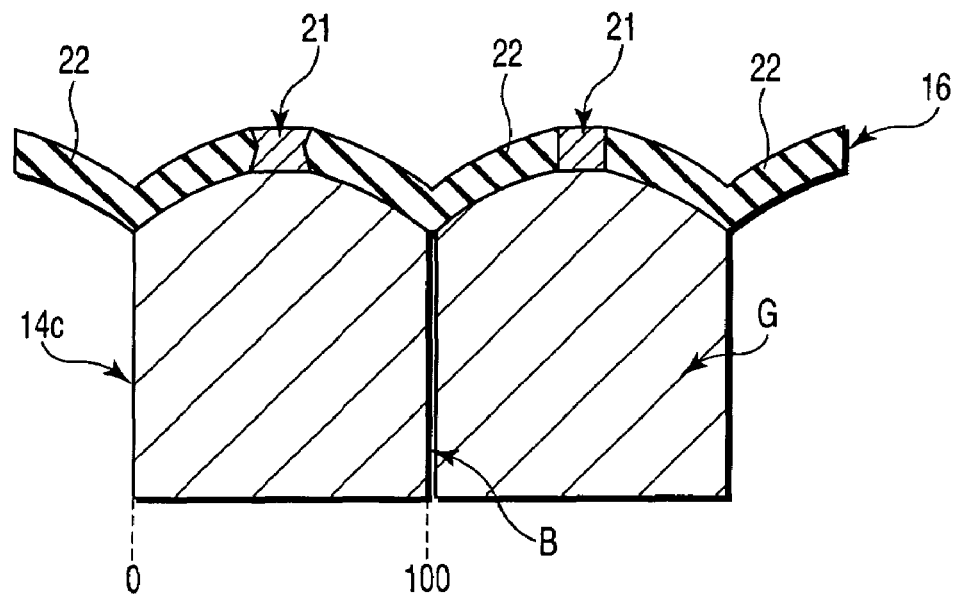
FIGS. 2A and 2B are cross-sectional views schematically showing a spacer layer in a magnetoresistive element according to an embodiment of the present invention.

FIG. 1A shows a perspective view of a magnetoresistive element (CCP-CPP element) according to an embodiment of the present invention. The magnetoresistive element shown in FIG. 1A has a lower electrode 11, an underlayer 12, a pinning layer 13, a pinned layer 14 (a lower pinned layer 14a, a magnetic coupling layer 14b and an upper pinned layer 14c), a spacer layer (CCP-NOL) 16, a free layer 18, a cap layer 19, and an upper electrode 20, which are formed on a substrate (not shown). The spacer layer (CCP-NOL) 16 includes an insulating layer 22 and current paths 21 penetrating the insulating layer 22. FIG. 1B shows a cross-sectional view of the upper pinned layer 14c, the spacer layer 16 and the free layer 18.

A lower metal layer may be formed under the spacer layer 16. The lower metal layer is used as a source of the current paths 21 in the spacer layer 16. The lower metal may finally not remain as a definite metal layer. Also, an upper metal layer may be formed on the spacer layer 16 but is not essential. Thus, for simplification, the lower and upper metal layers for the spacer layer 16 are omitted in FIGS. 1A and 1B.

With reference to FIG. 2A, the nano fine structure of the spacer layer 16 in the magnetoresistive element (CCP-CPP element) according to an embodiment of the present invention will be briefly described. FIG. 2A is an enlarged cross-sectional view showing the underlying magnetic layer (upper pinned layer 14c) and the spacer layer 16. The spacer 16 is described as one comprising the insulating layer 22 consisting of $Al_2O_3$ in which the current paths 21 consisting of Cu are formed.

In embodiments of the present invention, each of the current paths serving to confine a current are formed on a central portion of a crystal grain in the underlying magnetic layer (in this case, the upper pinned layer 14c) as shown in FIG. 2A. The current path is a region containing significantly smaller amounts of oxygen and nitrogen than an insulating layer formed of an oxide, a nitride or an oxynitride, where the insulating layer has twice as much oxygen and nitrogen than the current path. The current path is generally in a crystal phase. The current path functions more appropriately in the crystal phase owing to low resistance. The oxide, nitride or oxynitride constituting the insulating layer may be $Al_2O_3$, which is amorphous, or MgO, which has a crystal structure. In the embodiments of the present invention, a grain boundary in a magnetic film can be defined as the interface between crystal grains. The most easy way to define a crystal grain is to define it as a protruded portion forming irregularities as schematically shown in FIG. 2A. That is, the period of the irregularities can be defined as the size of a crystal grain. The irregularities are identified on the basis of those at the interface between the oxide forming the spacer layer and the lower magnetic layer. The top of the protruded portion of the irregularities corresponds to a central portion of the crystal grain. The recessed portion corresponds to the grain boundary. In this case, the thickness in the depth direction to be observed by a TEM photograph must be reduced sufficiently to allow a crystal lattice to be clearly viewed.

Also, instead of the simple irregularities, the discontinuity of the crystal lattice between adjacent crystal grains can be used to define the crystal grain and the grain boundary. That is, the crystal lattice is almost continuous within the same crystal grain. The crystal lattice is discontinued at a particular position on the interface, that is, the grain boundary.

Figure 7:
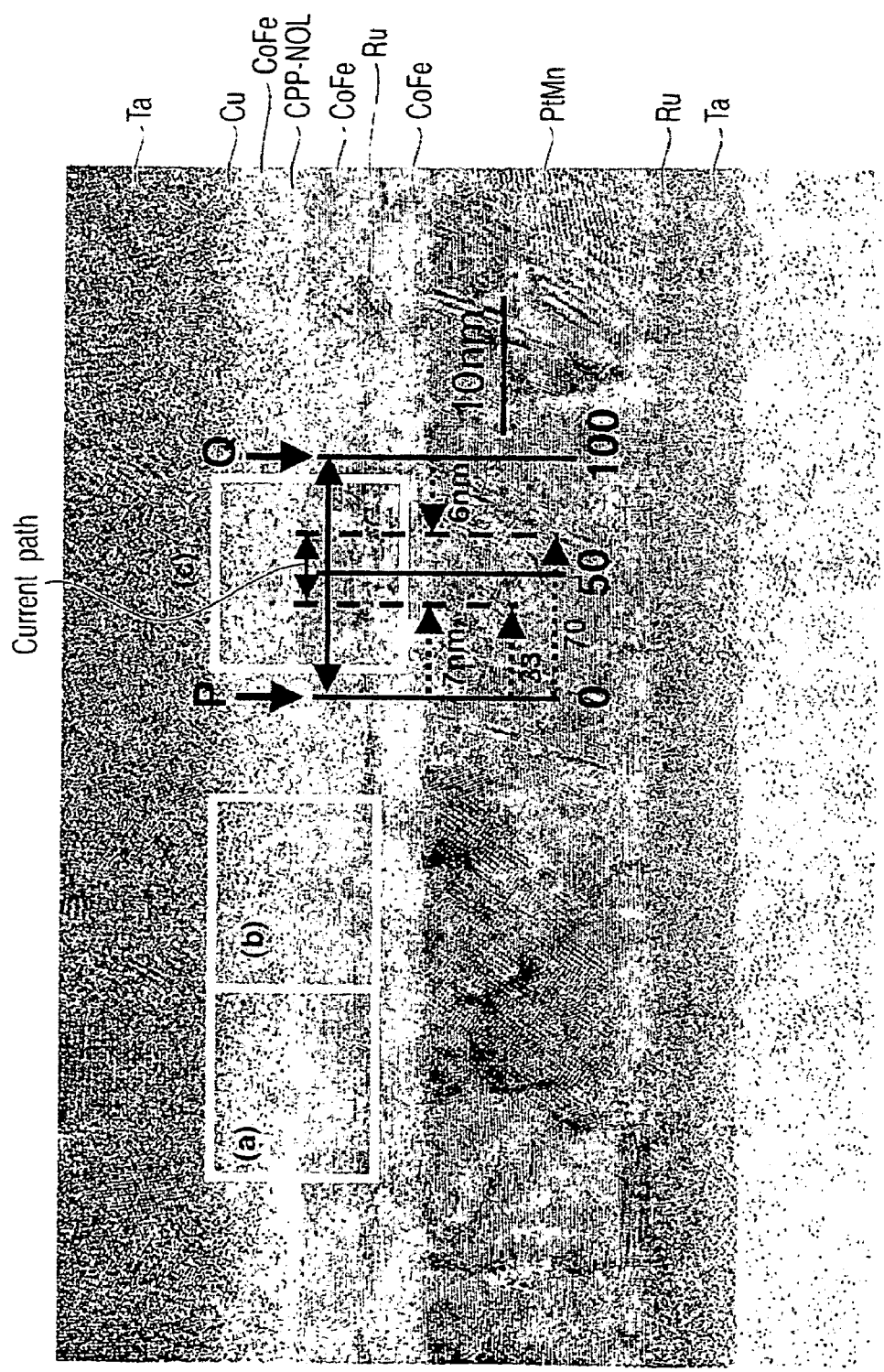
FIG. 7 is a cross-sectional TEM photograph of the CCP-CPP element according to Example 1.

On the basis of these definitions, FIG. 7 will be referred to as an example. For example, points P and Q can be defined as grain boundaries and the region between the points P and Q can be defined as a crystal grain.

Moreover, when an electron diffraction pattern with a size of about 1 nm is scanned on the lower magnetic layer under the spacer layer in a transverse direction in the surface thereof, a region exhibiting the same diffraction pattern may be determined to belong to the same crystal grain, and a transition region exhibiting change of diffraction pattern may be determined to be a grain boundary. However, also in this case, the observation may be affected by crystal grains in the depth direction of the TEM sample. Accordingly, the thickness of the TEM sample must be sufficiently reduced.

Supposing that an in-plane position of one end of a crystal grain is set to 0 and an in-plane position of a grain boundary adjacent to the other end of the crystal grain is set to 100, the central portion of the crystal grain is referred to as a region in a range between 20 and 80 of the in-plane position. Also, the central portion of the crystal grain is referred to as a region at least 3 nm away from a grain boundary between crystal grains contained in the magnetization pinned layer or magnetization free layer underlying the spacer layer. In other words, the central portion of the crystal grain is a region located within 2 nm from a protrusion (top) of a crystal grain forming surface irregularities.

In such a structure, since the nonmagnetic metal layer (in this case, a Cu layer) of the current path 21 forms an interface with the underlying magnetic layer on the central portion of the crystal grain having few crystal defects, an appropriate interface can be formed therebetween. This enhances the spin-dependent interface scattering effect of a current confined by the current path 21. Further, when a current passes through the interface between the magnetic layer and the nonmagnetic layer and then spreads in the underlying magnetic layer (this may occur in either current direction, that is, either downward or upward, depending on the direction of the current), it passes through the magnetic layer in a region located far from the grain boundary, which scatters electron conduction. Consequently, the spin-dependent bulk scattering effect in the underlying magnetic layer is enhanced without causing the current to be scattered by the grain boundaries. As described above, if each current path is formed in the central portion of the corresponding crystal grain in the underlying magnetic layer, this makes it possible to exert both high spin-dependent interface scattering effect and high spin-dependent bulk scattering effect, and this is in turn very advantageous for achieving a high MR ratio.

In an embodiment of the present invention, if the dispersion of crystal orientation angle of the current path is at most 5°, this makes it possible to exert both high spin-dependent interface scattering effect and high spin-dependent bulk scattering effect, and this is very advantageous for achieving a high MR ratio. In this case, the position at which the current path is formed is not particularly limited.

Figure 2B:
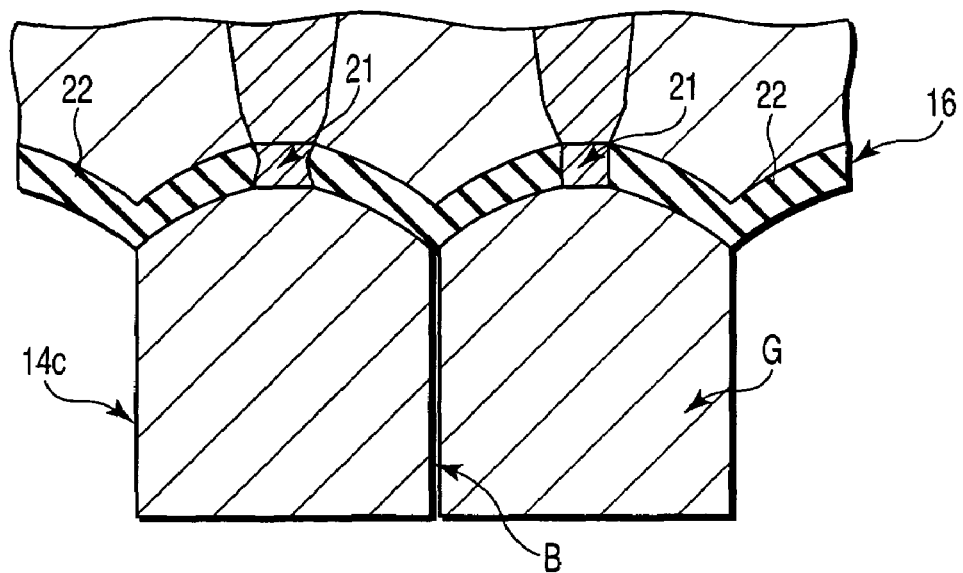

If each current path is formed in the central portion of the corresponding crystal grain, a crystal lattice is likely to be continuously formed between the underlying magnetic layer and the current path and the upper magnetic layer as shown in FIG. 2B. When the crystal lattice is thus continuously formed, a current passes through a region free from crystal defects from the underlying magnetic layer to the upper magnetic layer via the current path. This improves both spin-dependent interface scattering effect and spin-dependent bulk scattering effect. It is thus possible to provide a magnetoresistive element exhibiting a high MR ratio.

The method described below is used to form a spacer layer in the magnetoresistive element according to an embodiment of the present invention. Here, a case where a spacer layer 16 comprising an insulating layer 22 of $Al_2O_3$ with an amorphous structure and current paths 21 of Cu with a metal crystal structure formed therein will be described. First, a lower metal layer (for example, Cu) serving as a source of the current paths is deposited on the upper pinned layer 14c containing crystal grains separated by grain boundaries extending across the thickness thereof. A metal layer (for example, AlCu or Al) to be oxidized into an insulating layer is deposited on the lower metal layer. A pretreatment is carried out by irradiating the metal layer to be oxidized with an ion beam of a rare gas (for example, Ar). The pretreatment is referred to as a pre-ion treatment (PIT). PIT causes the lower metal layer to be partly sucked up in the metal layer to be oxidized by which the lower metal layer penetrates the metal layer to be oxidized. An oxidation gas (for example, oxygen) is supplied to oxidize the metal layer to be oxidized. The oxidation converts the metal layer to be oxidized into the insulating layer 22 of $Al_2O_3$ and, at the same time, forms current paths 21 penetrating the insulating layer 22, thus forming a spacer layer 16. This method enables each current path 21 to be formed on the central portion of the corresponding crystal grain in the underlying magnetic layer (in this case, the upper pinned layer 14c).

EXAMPLES

Examples of the present invention will be described below with reference to the drawings. In the examples below, the composition of an alloy means atomic %.

Example 1

In the present Example, a magnetoresistive element (CCP-CPP element) having the structure shown in FIG. 1A is manufactured. Specifically, the films mentioned below are sequentially formed on a substrate (not shown):

lower electrode 11,
underlayer 12: Ta [5 nm]/Ru [2 nm],
pinning layer 13: $Pt_{50}Mn_{50}$ [15 nm], pinned layer 14: Co$_{90}$Fe$_{10}$ [4 nm]/Ru [0.9 nm]/Co$_{90}$Fe$_{10}$ [4 nm], lower metal layer 15: Cu [0.5 nm], spacer layer (CCP-NOL) 16: an insulating layer 22 of Al$_2$O$_3$ and current paths 21 of Cu (prepared by depositing Al$_{90}$Cu$_{10}$ [0.9 nm], followed by performing PIT and IAO treatments), upper metal layer 17: Cu [0.25 nm], free layer 18: Co$_{90}$Fe$_{10}$ [4 nm], cap layer 19: Cu [1 nm]/Ru [10 nm], and upper electrode 20.

In the description below, a set of the spacer layer 16, in a narrow sense, and two metal layers located over and under the spacer layer 16 may be referred to as the spacer layer. The CCP-CPP element in FIG. 1A is of a bottom type in which the pinned layer 14 is placed below. However, of course, the CCP-CPP element may be of a top type in which the pinned layer 14 is placed above, as described below. Now, a detailed description will be given below of a method for manufacturing a CCP-CPP element according to the present Example.

A lower electrode 11 serving to allow a current to flow perpendicularly to the spin-valve film is formed on a substrate (not shown). Then, layers of a CPP spin-valve film from the underlayer to the cap layer are formed on the lower electrode 11.

FIG. 3 shows a schematic diagram of a deposition apparatus used in this case. As shown in FIG. 3, the deposition apparatus has a transfer chamber (TC) 50 around which the following chambers are provided via respective gate valves: a load-lock chamber 51, a pre-cleaning chamber 52, a first metal deposition chamber (MC1) 53, a second metal deposition chamber (MC2) 54, and an oxidation chamber (OC) 60. In this apparatus, the substrate can be transferred, in a vacuum, among the chambers, connected via the gate valves. This keeps the surface of the substrate clean.

The substrate is set in the load lock chamber 51. Metal is deposited in the metal deposition chambers 53 and 54. Oxidation is carried out in the oxidation chamber 60. The ultimate vacuum in the metal deposition chamber is preferably $1 \times 10^{-8}$ Torr or less, generally about $5 \times 10^{-10}$ to $5 \times 10^{-9}$ Torr. The ultimate vacuum in the transfer chamber is on the order of $10^{-9}$ Torr. The ultimate vacuum in the oxidation chamber is $8 \times 10^{-8}$ Torr or less. The metal deposition chamber has multiple (five to ten) tatgets. Examples of the deposition method include sputtering such as DC magnetron sputtering or RF magnetron sputtering, an ion beam sputtering, and evaporation.

Ta [5 nm]/Ru [2 nm] is deposited on the lower electrode 11 as an underlayer 12. Ta is a buffer layer that suppresses roughening of the lower electrode. Ru is a seed layer that controls the crystal orientation and grain size of the spin-valve film formed thereon.

The buffer layer may be composed of Ta, Ti, W, Zr, Hf, Cr, or their alloy. The thickness of the buffer layer is preferably about 2 to 10 nm, more preferably 3 to 5 nm. An excessively small thickness of the buffer layer eliminates its buffering effect. An excessively large thickness of the buffer layer is not preferable because it increases series resistance that does not contribute to the MR ratio. However, if the seed layer to be deposited on the buffer layer also exerts a buffer effect, the buffer of Ta or the like need not necessarily be provided.

The seed layer suffices to be a material that can control the crystal orientation of a layer deposited on the seed layer. The seed layer is preferably a metal layer having an hcp structure or an fcc structure. Using Ru as the seed layer enables the crystals in the spin-valve film on the seed layer to have fcc (111) orientation. Using Ru as the seed layer enables the crystal orientation of PtMn to maintain an ordered fct structure, and also enables the crystal orientation of a bcc metal to maintain bcc (110) orientation. Further, the seed layer makes it possible to control the grain size of the spin-valve film to 10 to 40 nm. This enables a high MR ratio to be achieved without varying the characteristics of the CCP-CPP element even with reduction in the size of the CCP-CPP element. A relatively favorable crystal orientation can be realized with which X-ray diffraction indicates that rocking curves of the fcc (111) peak of the spin-valve film and the fct (111) peak of PtMn or bcc (110) peak have a full-width at half maximum of 3.5 to 6°. The dispersion angle of the crystal orientation can also be determined on the basis of diffraction spots by cross-sectional TEM.

The seed layer may be composed of, instead of Ru, for example, Ni$_x$Fe$_{100-x}$ (x=90 to 50%, preferably 75 to 85%) or (Ni$_x$Fe$_{100-x}$)$_{100-y}$X$_y$ (X=Cr, V, Hf, Zr, or Mo) preparing by adding a third element to NiFi to make it nonmagnetic. The NiFe-based seed layer provides better crystal orientation than the Ru-based seed layer. The rocking curve in the case of using the NiFe-based seed layer has a full-width at half maximum of 3 to 5° when determined as described above. To provide an appropriate grain size of 10 to 40 nm as described above, it is preferable to set the composition y of the third element X to about 0 to 30%. A larger amount of additional element is preferably used in order to make the grain size larger than 40 nm. In the case of NiFeCr, for example, it is preferable to set the amount of Cr at 35 to 45% and to use a composition indicating a boundary phase between fcc and bcc. However, when used in a read head adapted for high-density recording with a size of 100 nm or less, an excessively large grain size of the seed layer is not so preferable because this may lead to variation in characteristics. On the other hand, when used in MRAM with a size of 100 nm or more, for example, such a seed layer that has an increased grain size can be used.

The thickness of the seed layer is preferably about 1.5 to 6 nm, more preferably 2 to 4 nm. An extremely small thickness of the seed layer eliminates effect of controlling the crystal orientation. An excessively large thickness of the seed layer may increase the series resistance and also may lead to unevenness at the interfaces in the spin-valve film.

A pinning layer 13 is deposited on the underlayer 12. The pinning layer 13 has a function of providing unidirectional anisotropy to a ferromagnetic layer, which is deposited on the pinning layer 13 and constitutes the pinned layer 14, to fix the magnetization thereof. The pinning layer 13 may be made of an anti-ferromagnetic material such as PtMn, PdPtMn, IrMn and RuRhMn. To provide a unidirectional anisotropy of a sufficient intensity, the thickness of the pinning layer 13 is appropriately set. For PtMn or PdPtMn, the thickness is preferably about 8 to 20 nm, more preferably 10 to 15 nm. For IrMn or RuRhMn, the thickness is preferably 5 to 18 nm, more preferably 7 to 15 nm because even a thickness smaller than that of PtMn or the like enables to impart unidirectional anisotropy. From a standpoint of a narrow gap needed in high-density recording, a pinning layer with a small total thickness is preferred. Thus, IrMn is more preferable than PtMn and PdPtMn. In view of providing a good pinning property, IrMn is the most preferable material. The anti-ferromagnetic layer generally has a high resistivity of 100 Ωμm or more. This may increase the series resistance, which does not contribute directly to the MR ratio, thus increasing the RA value. To avoid this problem, a hard magnetic layer may be used in place of the anti-ferromagnetic layer. The hard magnetic layer may be, for example, CoPt (Co=50 to 85%), (Co$_x$Pt$_{100-x}$)$_{100-y}$Cr$_y$ (x=50 to 85%, y=0 to 40%), or FePt (Pt=40 to 60%). The relatively low resistivity of the hard magnetic layer (particularly CoPt) makes it possible to suppress an increase in series resistance and RA.

A pinned layer 14 is formed on the pinning layer 13. In the present Example, the pinned layer 14 is a synthetic pinned layer consisting of a lower pinned layer 14a ($Co_{90}Fe_{10}$), a magnetic coupling layer 14b (Ru), and an upper pinned layer 14c ($Co_{90}Fe_{10}$ [4 nm]). The pinning layer (PtMn) 13 is exchange-coupled with the lower pinned layer 14a, located immediately above the pinning layer 13, so that they have unidirectional anisotropy. The lower pinned layer 14a and the upper pinned layer 14c, located under and over the magnetic coupling layer 14b, are magnetically coupled together strongly so as to have anti-parallel magnetizations. In this case, $Co_{90}Fe_{10}$ is used as the upper pinned layer 14c. However, it is preferable to use a FeCo alloy (Fe>30%) with a bcc structure instead of $Co_{90}Fe_{10}$, in view of providing a high MR ratio. Actually, since a pinned layer with the bcc structure enhances the interface scattering effect, it brings about an increased MR ratio. Specific examples of the pinned layer with the bcc structure are as follows:

($Fe_{50}Co_{50}$ [1 nm]/Cu [0.25 nm])×2/$Fe_{50}Co_{50}$ [1 nm],
($Fe_{80}Co_{20}$ [1 nm]/Cu [0.25 nm])×2/$Fe_{80}Co_{20}$ [1 nm],
$Co_{90}Fe_{10}$ [1 nm]/Cu [0.25 nm]/$Fe_{50}Co_{50}$ [1 nm]/Cu [0.25 nm]/$Fe_{50}Co_{50}$ [1 nm],
$Co_{90}Fe_{10}$ [1 nm]/Cu [0.25 nm]/$Fe_{80}Co_{20}$ [1 nm]/Cu [0.25 nm]/$Fe_{80}Co_{20}$ [1 nm],
$Co_{90}Fe_{10}$ [1 nm]/Cu [0.25 nm]/$Fe_{50}Co_{50}$ [1.5 nm],
$Co_{90}Fe_{10}$ [1 nm]/Cu [0.25 nm]/$Fe_{80}Co_{20}$ [1.5 nm],
$Co_{90}Fe_{10}$ [0.5 to 1 nm]/$Fe_{50}Co_{50}$ [1.5 to 2.5 nm],
$Co_{90}Fe_{10}$ [0.5 to 1 nm]/$Fe_{80}Co_{20}$ [1.5 to 2.5 nm],
$Fe_{50}Co_{50}$ [2 to 3 nm], and $Fe_{80}Co_{20}$ [2 to 3 nm].

Here, the very thin Cu layer is inserted between the magnetic layers in order to enhance the spin-dependent bulk scattering effect in the magnetic layers. In this case, the thickness of the Cu layer must be small enough to allow the magnetic layers over and under the Cu layer to be ferromagnetically coupled together. Specifically, the thickness is preferably 0.1 to 1 nm, more preferably 0.2 to 0.5 nm. An excessively small thickness of the Cu layer may suppress the enhancement of the bulk scattering effect. An excessively large thickness of the Cu layer may degrade the bulk scattering effect. This may also weaken the magnetic coupling between the magnetic layers over and under the nonmagnetic Cu layer, resulting in insufficient characteristics of the pinned layer. This is not preferable. Instead of Cu, Hf, Zr or Ti may be used as a material for the nonmagnetic layer between the magnetic layers. On the other hand, the thickness of the magnetic layer such as FeCo is preferably 0.5 to 2 nm, more preferably about 1 to 1.5 nm.

Further, $Fe_{80}Co_{20}$ is used instead of $Co_{90}Fe_{10}$ or $Fe_{50}Co_{50}$ because $Fe_{80}Co_{20}$ has a more stable bcc structure and may thus be more desirable than $Fe_{50}Co_{50}$. $Co_{90}Fe_{10}$ with the fcc structure is provided on Ru because when the magnetic layer on the Ru layer has an Fe-rich composition, the anti-ferromagnetic coupling between the magnetic layers over and under the Ru layer may be weakened. To avoid this, it may be desirable that a cobalt-rich material such as CoFe or Co be provided only immediately above the Ru layer. Moreover, besides the stacked including very thin Cu, the two-layered configuration of $Co_{90}Fe_{10}$/$Fe_{50}Co_{50}$ or $Co_{90}Fe_{10}$/$Fe_{80}Co_{20}$ may be effective for achieving both favorable magnetic characteristic and high MR ratio. In the two-layered configuration, $Co_{90}Fe_{10}$ is stacked on the Ru layer to improve the magnetic coupling via Ru and $Fe_{50}Co_{50}$ or $Fe_{80}Co_{20}$ having the bcc structure and exerting a high spin-dependent interface scattering effect is stacked on $Co_{90}Fe_{10}$.

The lower pinned layer 14a is preferably designed to have a magnetic thickness Bs*t (the product of saturated magnetization Bs and thickness t) almost equal to that of the upper pinned layer 14c. By way of example, if the upper pinned layer 14c is ($Fe_{50}Co_{50}$ [1 nm]/Cu [2.5 nm])×2/$Fe_{50}Co_{50}$ [1 nm], it has a magnetic thickness 2.2T×3 nm=6.6 Tnm because the saturated magnetization of FeCo thin film is about 2.2T. Since the saturated magnetization of $Co_{90}Fe_{10}$ thin film is about 1.8T, the thickness t of the lower pinned layer 14a which provides the magnetic thickness equal to the above is 6.6 Tnm/1.8T=3.66 nm. Consequently, $Co_{90}Fe_{10}$ of thickness about 3.6 nm is desirably used. The thickness of the magnetic layer used as the lower pinned layer is preferably about 2 to 5 nm in connection with the intensity of unidirectional anisotropy field induced by the pinning layer (PtMn) and the intensity of the anti-ferromagnetic coupling field between the lower pinned layer and the upper pinned layer via the Ru layer. An excessively small thickness thereof reduces the MR ratio. An excessively large thickness thereof makes it difficult to obtain a sufficient unidirectional anisotropy field required for device operation.

For the lower pinned layer 14a, a $Co_xFe_{100-x}$ alloy (x=0 to 100%), a $Ni_xFe_{100-x}$ alloy (x=0 to 100%), or alloys prepared by adding a nonmagnetic element to the above alloys may be used instead of $Co_{90}Fe_{10}$.

The magnetic coupling layer 14b (Ru) has a function of inducing anti-ferromagnetic coupling between the upper and lower magnetic layers to form a synthetic pinned layer structure. The Ru layer serving as the magnetic coupling layer 14b preferably has a thickness of 0.8 to 1 nm. Any material other than Ru may be used provided that it can cause sufficient anti-ferromagnetic coupling between the upper and lower magnetic layers.

The upper pinned layer 14c ($Co_{90}Fe_{10}$ [4 nm]) constitutes a part of the spin-dependent scattering unit. If a magnetic material with a bcc structure is used at the interface with the spacer layer, it exerts a high spin-dependent interface scattering effect, making it possible to achieve a high MR ratio as described before. Examples of a FeCo alloy with the bcc structure include $Fe_xCo_{100-x}$ (x=30 to 100%) and an alloy prepared by adding an additive element to $Fe_xCo_{100-x}$. Since many metal materials used for the spin-valve film have an fcc or fct structure, only the upper pinned layer may have the bcc structure. An excessively small thickness of the upper pinned layer makes it difficult to stably maintain the bcc structure. This prevents a high MR ratio from being obtained. Consequently, the thickness of the upper pinned layer is preferably set to 2 nm or more. On the other hand, the upper pinned layer is preferably has a thickness of 5 nm or less in order to obtain a large pinning magnetic field. If the pinned layer is formed of a magnetic layer having the bcc structure, which is likely to achieve a high MR ratio, the layer with the bcc structure preferably has a thickness of 2 nm or more in order to maintain the bcc structure more stably. The layer with the bcc structure preferably has a thickness of about 2.5 to 4 nm in order to achieve both a large pinning magnetic field and the stability of the bcc structure. The composition of the FeCo-based magnetic film that allows a more stable bcc structure to be obtained on a phase diagram ranges from $Fe_{75}Co_{25}$ to $Fe_{85}Co_{15}$. The upper pinned layer may be composed of a CoFe alloy with the fcc structure or a cobalt alloy with the fcc structure instead of a magnetic material with the bcc structure. For example, any of a single substance metal such as Co, Fe and Ni, and an alloy containing these elements may be used. The magnetic materials for the upper pinned layer can be ranked as follows in order of the MR ratio achieved using the materials: an alloy material with the bcc structure, a cobalt alloy with 50% or more of cobalt composition, and a nickel alloy with 50% or more of Ni composition.

An upper pinned layer composed of a FeCo—Cu alloy may be used instead of an upper pinned layer in which an FeCo layer and a Cu layer are alternately stacked. Example of such an FeCoCu alloy includes, for example, $(Fe_xCo_{100-x})_{100-y}Cu_y$, (x=30 to 100%, y=about 3 to 15%). However, another composition range may be used. The element added to FeCo may be Hf, Zr or Ti instead of Cu. The upper pinned layer may be a single-layer film composed of Co, Fe or Ni, or an alloy material of Co, Fe and Ni. For example, a $Co_{90}Fe_{10}$ single layer may be used as an upper pinned layer with the simplest structure. An additive element may be added to the above material.

Then, a spacer layer 16 having a current-confined-path structure (CCP structure) is formed. The oxidation chamber 60 shown in FIG. 3 is used to form a spacer layer 16. With reference to FIG. 4, the configuration of the oxidation chamber 60 will be described. As shown in FIG. 4, the oxidation chamber 60 is evacuated by a vacuum pump 61. An oxygen gas, the flow rate thereof is controlled with a mass-flow controller (MFC) 63, is introduced into the oxidation chamber 60 through an oxygen supply pipe 62. An ion source 70 is provided in the oxidation chamber 60. Types of the ion source include ICP (Inductive Coupled Plasma), capacitive coupled plasma, ECR (Electron-Cyclotron Resonance), and Kauffman. A substrate holder 80 and a substrate 1 are arranged opposite the ion source 70. Three grids 71, 72 and 73 are provided at an ion discharging port to adjust ion acceleration. A neutralizer 74 is provided outside the ion source 70 to neutralize ions. The substrate holder 80 is supported so that it can be tilted. The incident angle of ions on the substrate can be varied over a wide range. The value of a typical incident angle is between 15° and 60°.

With reference to FIGS. 5A, 5B, 5C and 5D, a method of forming the spacer layer 16 will be described. As described above, in the present Example, a spacer layer 16 comprising the insulating layer 22 of $Al_2O_3$ and the current paths 21 of Cu penetrating the insulating layer 22 is formed. The current paths 21 substantially consist of nonmagnetic metal. However, the current paths 21 may contain a small amount of magnetic metal diffused from the material constituting the underlying magnetic layer or the layer located on the spacer layer (in the present Example, the free layer). This is because slight thermal diffusion of elements may result from a heat treatment (270° C. and about 10 hours or a higher temperature and a shorter time, for example, 290° C. and about 4 hours) for improving the pinning characteristics of the anti-ferromagnetic layer such as PtMn and IrMn constituting the pinning layer.

Figure 5A:
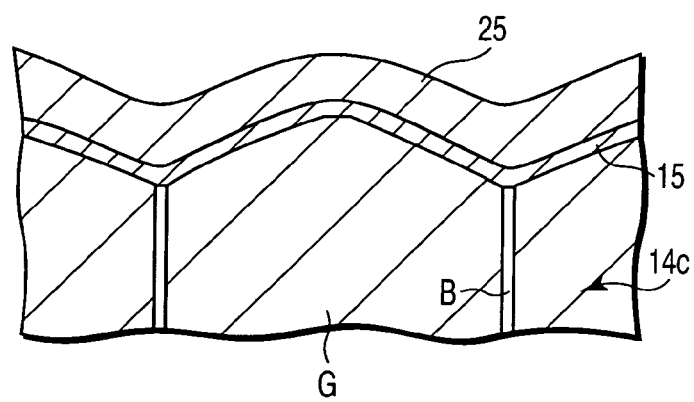
FIGS. 5A, 5B, 5C and 5D are cross-sectional views showing a process of manufacturing a spacer layer in the magnetoresistive element according to an embodiment of the present invention.
Figure 5B:
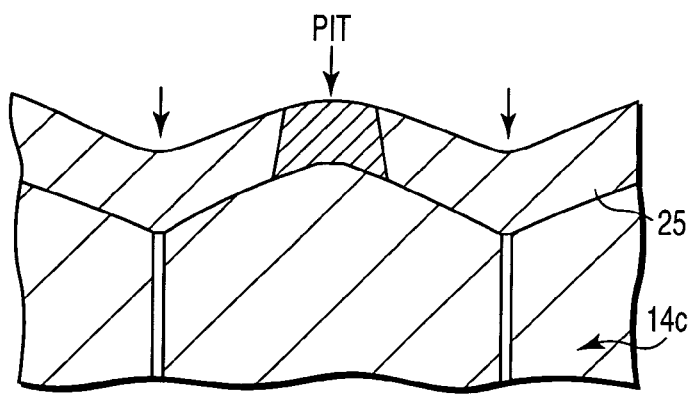
Figure 5C:
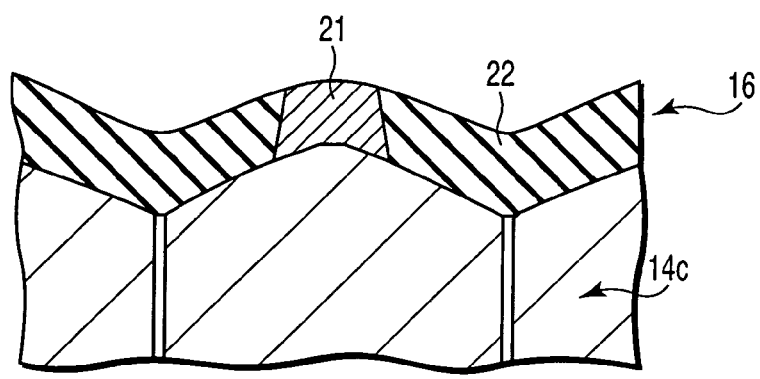
Figure 5D:
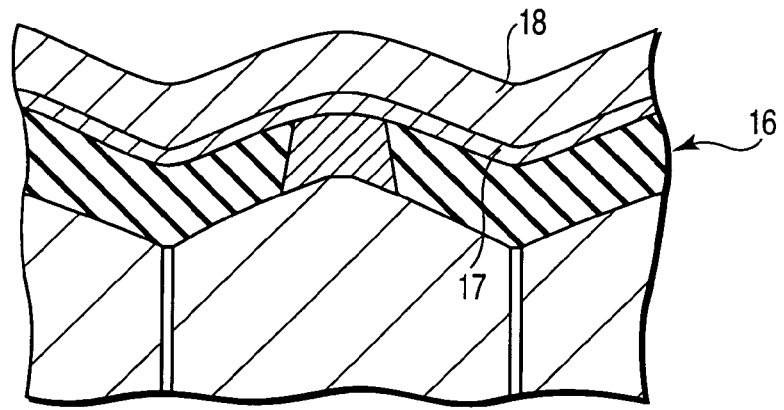

As shown in FIG. 5A, a lower metal layer 15 (for example, Cu) serving as a source of the current paths is deposited on the upper pinned layer 14c, containing crystal grains G separated by grain boundaries B extending across the thickness thereof. Then, a metal layer 25 (for example, AlCu or Al) to be oxidized into an insulating layer is deposited on the lower metal layer 15. As shown in FIG. 5B, a pretreatment is carried out by irradiating the metal layer to be oxidized with an ion beam of a rare gas (for example, Ar). This pretreatment is referred to as PIT (pre-ion treatment). PIT causes the lower metal layer 15 to be partly sucked up and intruded into the metal layer 25 to be oxidized 25. As shown in FIG. 5C, an oxidation gas (for example, oxygen) is supplied to oxidize the metal layer 25 while irradiating the metal layer with an ion beam of a rare gas (Ar, Xe, Kr or He). This method is referred to as the ion-assisted oxidation (IAO). This treatment forms a spacer layer 16 in which $Al_2O_3$ constituting the insulating layer 22 and Cu constituting the current paths 21 are separated with each other, utilizing a difference in oxidation energy, where Al is likely to be oxidized whereas Cu is unlikely to be oxidized. In the embodiments of the present invention, each of the current paths 21 is formed in a central portion of the corresponding crystal grain G contained in the upper pinned layer 14c at this stage. As shown in FIG. 5D, an upper metal layer 17 such as Cu is deposited on the spacer layer 16 and a free layer 18 is deposited on the upper metal layer 17. The upper metal layer 17 on the spacer layer 16 has a function for preventing the free layer 18 deposited thereon from being affected by an oxide film. However, the upper metal layer 17 need not necessarily be provided.

In the oxidation chamber 60 shown in FIG. 4, PIT can be carried out by irradiating the substrate 1 with an ion beam such as Ar, and IAO can be carried out by irradiating the substrate 1 with an ion beam such as Ar while supplying an oxygen gas through the oxygen supply pipe 62.

In the PIT step, Ar ions are applied under conditions of an acceleration voltage of 30 to 130 V, a beam current of 20 to 200 mA, and a treatment time of 30 to 180 seconds. In the present Example, the acceleration voltage is set to a range between 40 and 60 V. With a higher voltage range, the MR ratio may be reduced in some cases because of, for example, influence of a roughened surface after the PIT step. Further, the current value is set to a range between 30 and 80 mA, and the irradiation time is set to a range between 60 and 150 seconds. The deposited lower metal layer 15 (Cu layer) is in the form of a two-dimensional film. The PIT step causes Cu of the lower metal layer 15 to be sucked up and intruded into the metal layer 25 to be oxidized (AlCu layer), in which Cu forms current paths. Further, the ion-assisted oxidation (IAO) of the AlCu layer, which is the metal layer to be oxidized, is performed. During the IAO step, Ar ions are applied under conditions of an acceleration voltage of 40 to 200 V, a beam current of 30 to 200 mA, and a treatment time of 15 to 300 seconds, while oxygen is being supplied to. In the present Example, the acceleration voltage is set to a range between 50 and 100 V. With a higher voltage range, the treatment results in, for example, a roughened surface to reduce the MR ratio. Further, the current value is set to a range between 40 and 100 mA, and the irradiation time is set to a range between 30 and 180 seconds. Since Al is likely to be oxidized while Cu is unlikely to be oxidized, a spacer layer 16 comprising the insulating layer 22 of $Al_2O_3$ and the current paths 21 of Cu can be formed. In the present Example, the amount of oxygen exposure during oxidation based on IAO is set to a range between 2,000 and 4,000 L (1 L=1×10$^{-6}$ Torr×sec). If treatment is carried out during IAO such that not only Al but also the underlying magnetic layer is oxidized, the heat resistance and reliability of the CCP-CPP element are degraded, which is not preferable. To improve reliability, it is important that the magnetic layer located under the CCP spacer layer is in a metal state not oxidized. To achieve this, the amount of oxygen must be controlled on the basis of the above range of the oxygen exposure amount. Further, to form stable oxide using supplied oxygen, it is desirable that the oxygen gas is only allowed to flow while the substrate surface is irradiated with ion beams and that the flow of the oxygen gas is stopped while the substrate surface is not irradiated with any ion beams.

With the above method, since PIT or IAO is a process utilizing energy, the effect of sucking up of the metal from the underlying crystal grain is produced. In this case, the material located within a range that the energy of PIT or IAO reaches is sucked up into the overlying layer. That is, when the energy range in PIT or IAO is set so that the energy reaches the lower metal layer 15 (Cu), a source of the current paths 21, Cu concentrates at the central portion of each crystal grain to form a current path 21 of Cu. Such a process enables the formation of a favorable CCP structure in which each current path 21 is provided in the central portion of the corresponding crystal grain as shown in FIG. 2A. That is, to form favorable current paths 21, the processes which can supply such energy that Cu is sucked up before and during oxidation is preferred. To achieve this, RF plasma may be used in place of the ion beam. In the RF plasma, the voltage is automatically determined by setting the RF power. However, the value of the voltage is preferably within a range similar to that of the voltage value used for PIT or IAO carried out using the ion beam. If RF power is used, a current value is also automatically determined by setting the RF power. However, the preferable range of the current value is similar to that in the case of using the ion beam. That is, the RF plasma does not provide a high controllability because the voltage and the current cannot be controlled independently. However, even the RF plasma enables the PIT and IAO treatments.

Instead of the PIT treatment before oxidation or the IAO treatment during oxidation, a heat treatment such as substrate heating can be applied as an energy treatment. However, the substrate heating is not as preferable as the treatment using the ion beam or RF plasma. This is because, with the substrate heating, the energy applied covers all the thickness directions, making it difficult to perform control such that the highest energy is applied to Cu in the lower metal layer. That is, with a simple heat treatment, since diffusion occurs in all the layers, it is difficult to allow only Cu to be sucked up from the lower metal layer, a source of the current paths, to the overlying layer. In contrast, the ion beam or RF plasma preferably makes it possible to control the depth from the surface to which the effect of sucking up of Cu is to be produced by controlling the range of energy or current. The above energy and current ranges have been determined in view of this and are thus preferable.

The thickness of the lower metal layer 15 (Cu) is adjusted on the basis of the thickness of the metal layer 25 (AlCu) to be oxidized. That is, increasing the thickness of the AlCu layer requires an increase in the amount of Cu intruding into the AlCu layer during the PIT step, and consequently, the thickness of the Cu layer must be increased. For example, when the thickness of AlCu is set to a range between 0.6 and 0.8 nm, the thickness of Cu layer would be set to between about 0.1 and 0.5 nm. When the thickness of AlCu is set to a range between 0.8 and 1 nm, the thickness of Cu layer would be set to about between 0.3 and 1 nm. An excessively small thickness of the Cu layer prevents a sufficient amount of Cu from being supplied to the AlCu layer during the PIT process. This precludes the current paths of Cu from penetrating the AlCu layer up to the top thereof. In this case, the area resistance product RA is too large, and the MR ratio becomes an insufficient value. On the other hand, an excessively large thickness of the Cu layer allows a sufficient amount of Cu to be supplied to the AlCu layer during the PIT step. However, a thick Cu layer remains between the pinned layer 14 and the spacer layer 16. To achieve a high MR ratio with the CCP-CPP element, a current confined in the spacer 16 reaches the magnetic layer as it is confined. However, if a large Cu layer remains between the pinned layer 14 and the spacer layer 16, the current confined in the spacer layer 16 spreads before reaching the magnetic layer, thus adversely reducing the MR ratio.

Instead of Cu, Au or Ag may be used as a material for the lower metal layer 15, a source of the current paths 21. However, Cu is preferably more stable against heat treatment than Au or Ag.

If $Al_{90}Cu_{10}$ is used as the metal layer to be oxidized, then during the PIT step, not only Cu is sucked up from the lower metal layer but also Cu in AlCu is separated from Al to form current paths. Furthermore, if ion beam-assisted oxidation is carried out after the PIT step, the assisting effect by ion beam facilitates the separation of Cu from Al during advance of oxidation. Instead of $Al_{90}Cu_{10}$, Al containing no Cu, which is a material for the current paths, may be used for the metal layer to be oxidized. In this case, Cu, a material for the current paths, is supplied only by the underlying lower metal layer. If AlCu is used for the metal layer to be oxidized, the AlCu layer supplies Cu, a material for the current paths, during the PIT step. Accordingly, even if a thick insulating layer is to be formed, current paths can advantageously be formed relatively easily. If Al is used as the metal layer to be oxidized, Cu is unlikely to be mixed in $Al_2O_3$ formed by oxidation. Thus, advantageously, $Al_2O_3$ with increased voltage resistance is easily formed.

The thickness of the metal layer to be oxidized is set to a range between 0.6 and 2 nm for AlCu and is set to a range between about 0.5 and 1.7 nm for Al. The thickness of an insulating layer formed by oxidizing the metal layer would be a range of between about 0.8 and 3.5 nm. It is easy to produce an insulating layer with a thickness between 1.3 and 2.5 nm after oxidation. Such an insulating layer is advantageous in terms of the current-confined-path effect. The current paths penetrating the insulating layer would have a diameter of about 1 to 10 nm. A typical value of the diameter would be preferably between about 3 and 7 nm.

AlCu constituting the metal layer to be oxidized preferably has a composition represented as $Al_xCu_{100-x}$ (x=100 to 70%). An element such as Ti, Hf, Zr, Nb, Mg, Mo or Si may be added to AlCu. In this case, the composition of the additional element is preferably 2 to 30%. The addition of these elements may facilitate the formation of the CCP structure. Further, when a larger amount of any of these additional elements is distributed in the boundary regions between the $Al_2O_3$ insulating layer and the Cu current paths than in the other regions, the adhesion between the insulating layer and the current paths is improved to enhance electromigration resistance. In the CCP-CPP element, the spacer layer has a giant current density of $10^7$ to $10^{10}$ A/cm$^2$. Thus, it is important that the electromigration resistance can ensure the stability of Cu current paths during current conduction. However, the formation of an appropriate CCP structure ensures a sufficiently favorable electromigration resistance without adding any elements to the metal layer to be oxidized.

The material for the metal layer to be oxidized is not limited to an Al alloy to form $Al_2O_3$ but may be an alloy mainly composed of Hf, Zr, Ti, Ta, Mo, W, Nb, Mg or Si. The metal layer may be converted into a nitride or an oxynitride rather than being oxidized into an oxide. Whatever material is used as the metal layer to be oxidized, the thickness obtained after deposition is preferably between 0.5 and 2 nm and the thickness obtained after conversion into an oxide, nitride or oxynitride is preferably between about 0.8 and 3.5 nm.

An upper metal layer 17 of Cu [0.25 nm] is formed on the spacer layer 16. The upper metal layer 17 functions as a barrier layer to prevent the free layer deposited on the upper metal layer 17 from being oxidized upon coming into contact with the oxide in the spacer layer 16. The upper metal layer 17 on the spacer layer 16 need not necessarily be provided because the oxidation of the free layer may be avoided by, for example, optimizing annealing conditions. Thus, the lower metal layer 15 under the spacer layer 16 is essential because it is a source of the current paths (however, it does not always remain as a definite metal layer after the formation of current paths), whereas the upper metal layer 17 over the spacer layer 16 is not always essential. In view of manufacturing margins, the upper metal layer 17 on the spacer layer 16 is preferably formed. In addition to Cu, Au, Ag or Ru may be used as a material for the upper metal layer 17. The material for the upper metal layer 17 is preferably the same as that for the current paths 21 in the spacer layer 16. Interface resistance is increased by using different materials for the upper metal layer 17 and for the current paths. However, the use of the same material prevents increase in interface resistance. The thickness of the upper metal layer 17 is preferably between 0 and 1 nm, more preferably between 0.1 and 0.5 nm. An excessively large thickness of the upper metal layer 17 causes a current confined in the spacer layer 16 to be spread in the upper metal layer 17. This leads to an insufficient current-confined-path effect to lower the MR ratio.

A free layer 18 of $Co_{90}Fe_{10}$ [4 nm] is formed on the upper metal layer 17. Instead of a single CoFe free layer, $Co_{90}Fe_{10}$ [1 nm]/$Ni_{83}Fe_{17}$ [3.5 nm] may be deposited which is a conventional free layer composed of NiFe with CoFe interposed at the interface. For a high MR ratio, what is important is the magnetic material selected for a part of the free layer 18 located at the interface with the spacer layer. In this case, instead of the NiFe alloy, a CoFe alloy is preferably provided at the interface with the spacer layer. The present Example uses $Co_{90}Fe_{10}$, which is a CoFe alloy exhibiting a particularly stable soft magnetism among the CoFe alloys. If a CoFe alloy with a composition around $Co_{90}Fe_{10}$ is used, the thickness is preferably set to a range between 0.5 and 4 nm. If a CoFe alloy with another composition (for example, such a composition described in connection with the pinned layer) is used, the thickness is preferably set to a range between 0.5 and 2 nm. For example, if $Fe_{50}Co_{50}$ (or $Fe_xCo_{100-x}$ (x=45 to 85)) is used for the free layer as in the case of the pinned layer in order to enhance the spin-dependent interface scattering effect, the preferable range of the thickness is between 0.5 and 1 nm. This is because an excessively large thickness precludes the soft magnetism of the free layer from being maintained. If Fe containing no Co is used, the thickness may be between about 0.5 and 4 nm. This is because this material provides relatively favorable soft magnetism. A NiFe layer provided on the CoFe layer is a material exhibiting the most stable soft magnetism. Although the soft magnetism of the CoFe alloy is not very stable, it can be supplemented by providing the NiFe allow on the CoFe alloy. This results in a high MR ratio. The composition of the NiFe alloy is preferably $Ni_xFe_{100-x}$ (x=about 78 to 85%). A composition richer in Ni such as $Ni_{83}Fe_{17}$ is used instead of the composition $Ni_{81}Fe_{19}$ of usual NiFe because if a free layer is formed on a spacer layer having the CCP structure, an Ni composition required to realize zero magnetostriction is slightly changed. The thickness of the NiFe layer is preferably between about 2 and 5 nm. If the NiFe layer is not used, a free layer may be used in which a plurality of CoFe or Fe layers of thickness 1 to 2 nm and a plurality of very thin Cu layers of thickness about 0.1 to 0.8 nm are alternately stacked.

A cap layer 19 of Cu [1 nm]/Ru [10 nm] is stacked on the free layer 18. The cap layer 19 has a function for protecting the spin-valve film. The thickness of the Cu layer is preferably between about 0.5 and 10 nm. A Ru layer may be provided on the free layer 18 to a thickness of about 0.5 to 10 nm without providing any Cu layer. A metal layer other than the Ru layer may be provided on the Cu layer. The configuration of the cap layer is not particularly limited. Any other materials may be used provided that they can exert a capping effect. An upper electrode 20 is formed on the cap layer 19 to supply a current perpendicularly to the spin-valve film.

Figure 6:
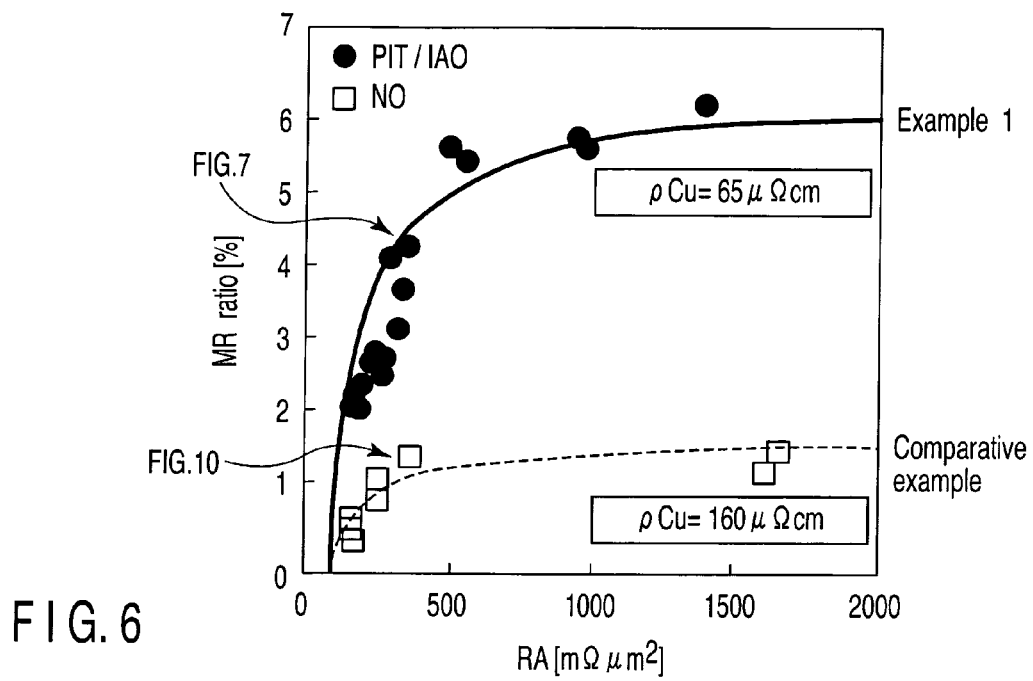
FIG. 6 is a diagram showing the evaluations of characteristics of a CCP-CPP element according to Example 1.

FIG. 6 shows the evaluations of characteristics of the CCP-CPP element according to the present Example. The characteristics are RA of 350 m$\Omega\mu m^2$, MR ratio of 4.3%, and ΔRA of 15 m$\Omega\mu m^2$. In this Example, both the pinned layer and the free layer use $Co_{90}Fe_{10}$ of an fcc structure, which is disadvantageous to obtain a high MR ratio compared with a material such as $Fe_{50}Co_{50}$ of a bcc structure. Nevertheless, such a high MR ratio would be achieved because each current path 21 can be provided in the central portion of the corresponding crystal grain in the underlying magnetic layer.

Figure 8A:
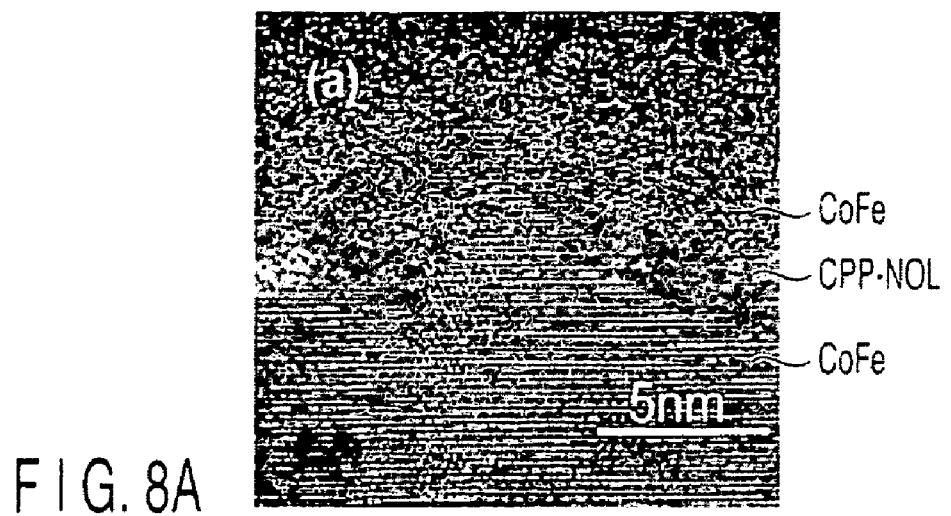
FIGS. 8A, 8B and 8C are enlarged cross-sectional TEM photographs showing a part of the CCP-CPP element according to Example 1.
Figure 8B:
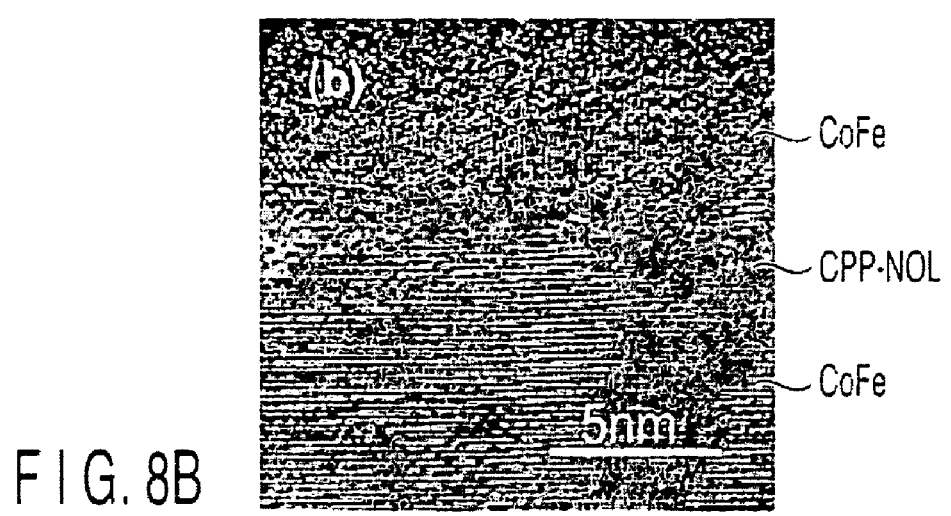
Figure 8C:
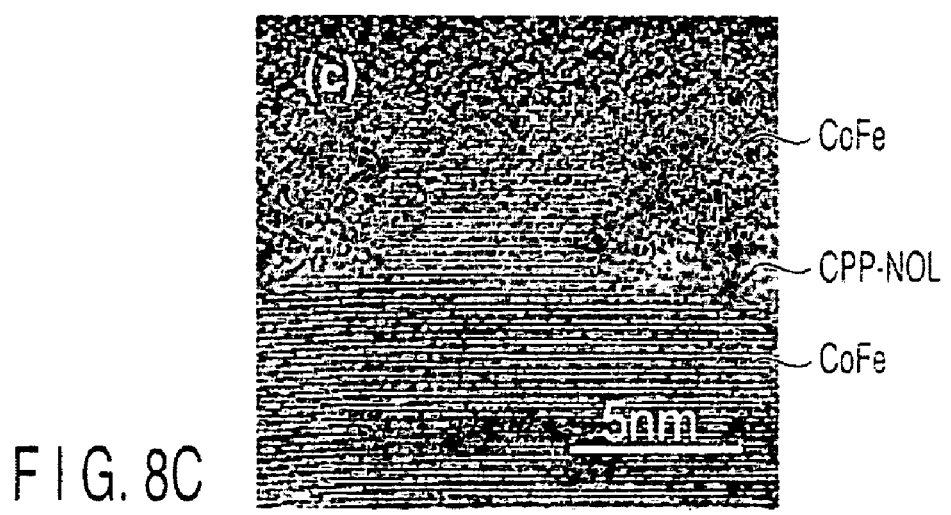

FIGS. 7, 8A, 8B and 8C show cross-sectional TEM photographs of the CCP-CPP element according to the present Example. FIGS. 8A, 8B and 8C are enlarged photographs corresponding to regions of (a), (b) and (c) in FIG. 7 where the current paths are formed. FIGS. 8A, 8B and 8C show that a current path is formed almost in the center of the corresponding protrusion of a crystal grain in the underlying magnetic layer before CCP is formed. It is difficult to determine whether or not the crystal grains in PtMn are the same as those in CoFe/Ru/CoFe. However, the same crystal grains are formed in the three layers of CoFe/Ru/CoFe. The interface between AlCu-NOL and CoFe shows crystal grains having irregularities, the period of which irregularities is between 10 and 20 nm. In the present specification, the size of the crystal grain is defined as the period of the irregularities as previously described. In this case, when the TEM sample is several times as thick as the crystal grain, the crystal grain may appear smaller owing to the interference effect of crystal grains located in the depth from the TEM cross-section. Accordingly, the thickness of the TEM sample must be sufficiently reduced to the extent that the crystal grains can be identified.

As seen in FIGS. 7, 8A, 8B and 8C, a current path (Cu) with a crystal structure is formed almost in the center of the corresponding crystal grain so as to penetrate amorphous alumina. For example, the region C in FIG. 7 specifically shows the positional relationship between a crystal grain and grain boundaries and a current path. In FIG. 7C, the points P and Q correspond to grain boundaries that define one crystal grain. When the points P and Q are defined as the in-plane positions 0 and 100, respectively, a current path with a crystal structure penetrating $Al_2O_3$ with an amorphous structure is formed between the in-plane positions 33 and 70, that is, almost in the center of the crystal grain. The distance between the grain boundary P and the current path is 7 nm; the current path is located away from the grain boundary P. The distance between the other grain boundary Q and the current path is 6 nm; the current path is also located away from the grain boundary Q. This structure enables the realization of a CCP-CPP spin-valve film having a high MR ratio; in the CCP-CPP spin-valve film, a high spin-dependent interface scattering effect is exerted on the interface between Cu and the magnetic layer, and a high spin-dependent bulk scattering effect is exerted on a current spread in the crystal grains in the underlying magnetic layer. Here, the diameter of the current path is about 5 nm; it is between 3 and 7 nm if a variation is taken into account.

Figure 9A:
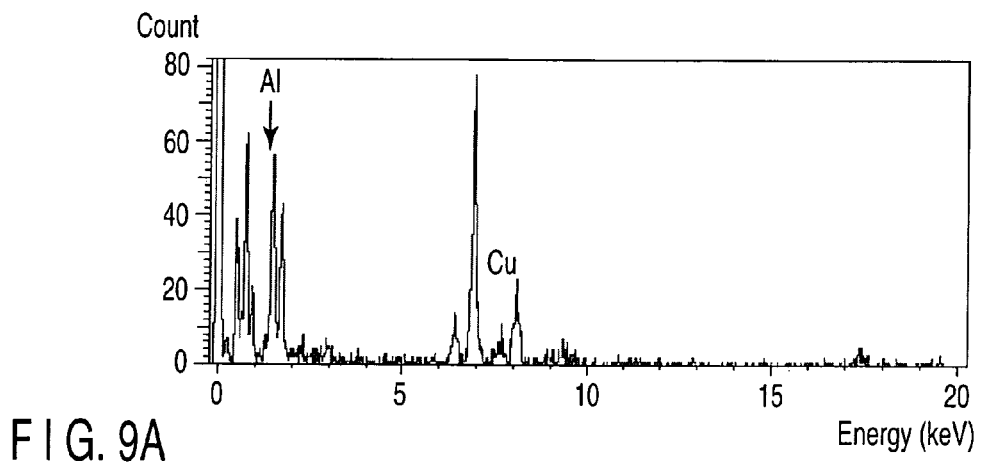
FIGS. 9A and 9B is a diagram showing the nano EDX analysis of the spacer layer in the CCP-CPP element according to Example 1.
Figure 9B:
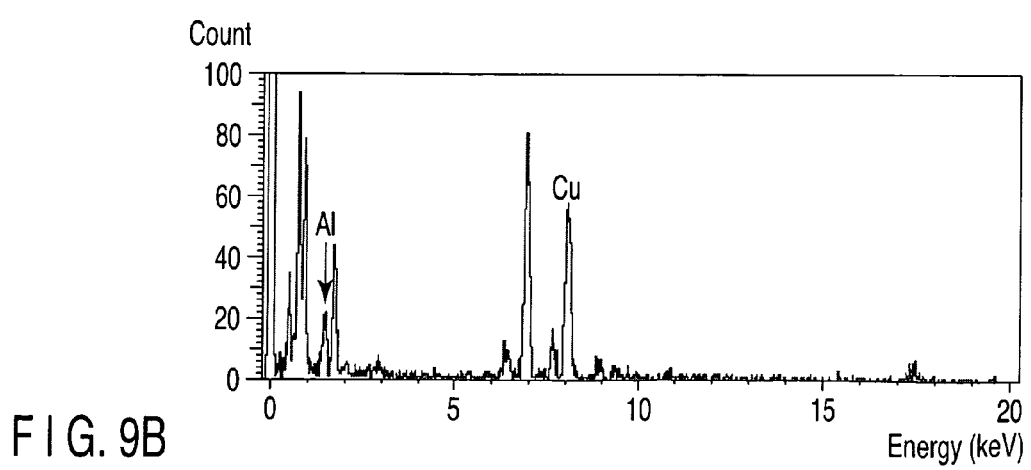

FIGS. 9A and 9B show the nano EDX analysis of the region of an amorphous oxide film and the region of a current path using a spot size of 1 nm. As shown in FIG. 9A, an Al-rich peak is observed in the amorphous region. As shown in FIG. 9B, a Cu-rich peak can be observed in the crystal region. These results indicate that $Al_2O_3$ is formed in the amorphous region, while a Cu current path is formed in the current path region. According to the peaks in nano-EDX, Cu is not completely separated from Al. Also, peaks of other elements can be observed. This is because the spot size is 1 nm, which is not sufficiently smaller than the value of thickness of $Al_2O_3$, so that elements in regions around the oxide layer are also detected, and because the TEM sample is relatively thick in the depth direction, so that fluctuation of the film in the depth direction and elements in crystal grains located deeper are detected in addition to the regions visible in the actual image.

FIG. 2A, already described, schematically shows the structure observed with TEM as shown in FIGS. 7, 8A, 8B and 8C. As shown in FIG. 2A, each current path is formed in the central portion of the corresponding underlying crystal grain. That is, supposing that an in-plane position of one end of each of the crystal grains G is set to 0 and an in-plane position of a grain boundary adjacent to the other end of the crystal grain is set to 100, the current path 21 corresponding the crystal grain is formed on a region in a range between 20 and 80 of the in-plane position. Alternatively, the current path 21 corresponding the crystal grain is formed on a region at least 3 nm away from ends of each of the crystal grains (or grain boundaries). Moreover, close observation of the TEM photograph shows a region in which the crystal grains in the upper pinned layer (CoFe) and in the free layer (CoFe) are integrated together via the current path, resulting in a continuous crystal. In general, if a magnetic layer is formed on an amorphous oxide, the resulting film is like a microcrystal and does not have an appropriate crystal orientation. In contrast, in the present Example, a region exhibiting an appropriate orientation is also formed in the upper magnetic layer, and the region directly takes over the crystal orientation of the current path. If such a structure can be realized, the underlying magnetic layer, Cu, and the upper magnetic layer are all formed of consistent crystal grains. Therefore, this provides a film having few crystal defects and which can exert a high spin-dependent interface scattering effect between the nonmagnetic layer and the magnetic layer. Further, the upper magnetic layer also exhibits a favorable crystallinity near the current path, thus also enabling a high spin-dependent bulk scattering effect to be exerted in the magnetic layer. That is, a high MR ratio can be achieved.

In contrast, with a CCP-CPP element of a comparative example according to the prior art, RA is 370 $\Omega\mu m^2$, MR ratio is 1.5%, and $\Delta RA$ is 5.0 $m\Omega\mu m^2$ as shown in FIG. 6. The element of the comparative example is manufactured using natural oxidation instead of energy-assisted oxidation to form a spacer layer.

Figure 10:
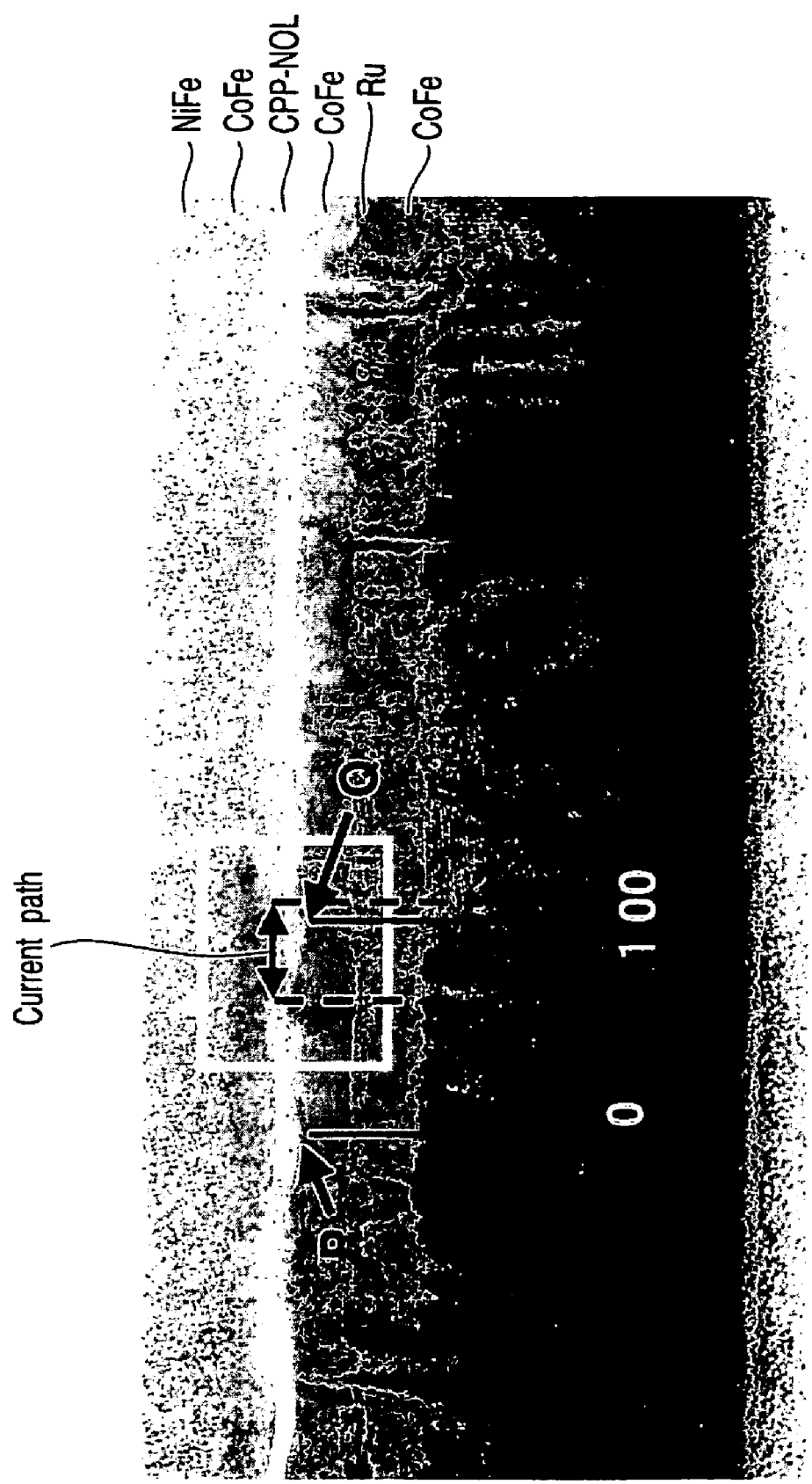
FIG. 10 is a cross-sectional TEM photograph of a CCP-CPP element according to Comparative Example.
Figure 11:
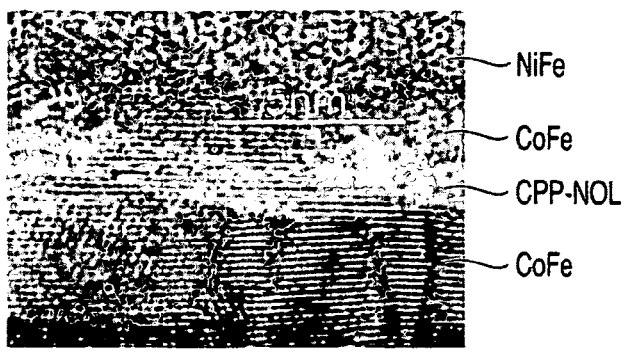
FIG. 11 is an enlarged cross-sectional TEM photograph showing a part of the CCP-CPP element according to Comparative Example.

FIGS. 10 and 11 show TEM photographs of the CCP-CPP element of the comparative example. The TEM photographs show that the natural oxidation also enables the formation of current paths consisting of metal crystal with a size between 3 and 7 nm and penetrating insulating $Al_2O_3$. However, in FIG. 11, a current path is formed on a recessed portion of a crystal grain in the underlying magnetic layer. For example, FIG. 10 shows the positional relationship between a crystal grain and grain boundaries and a current path. In FIG. 10, the points P and Q correspond to grain boundaries that define one crystal grain. When the points P and Q are defined as the in-plane positions 0 and 100, respectively, a current path with a crystal structure penetrating $Al_2O_3$ with an amorphous structure is formed at the in-plane position 100, corresponding to the grain boundary. The distance between the grain boundary Q and the current path is 0 nm. The current path is not located away from the grain boundary.

The current path is thus formed near the grain boundary because neither the oxidation process for forming a spacer layer nor the pretreatment is assisted with energy. This prevents the separation of Cu and Al from being facilitated, thus precluding Cu from being positioned to the central portion of the crystal grain. In this situation, current paths are formed at random positions. In addition, since reduction effect of oxygen is likely to be caused at the grain boundaries, many current paths are formed near the grain boundaries. Thus, in FIGS. 10 and 11, current paths are mainly formed on the corresponding grain boundaries. This is the greatest difference from the spacer layer in the present Example in which each current path is formed in the central portion of the corresponding crystal grain in the underlying magnetic layer as shown in FIGS. 7, 8A, 8B and 8C.

Figure 12:
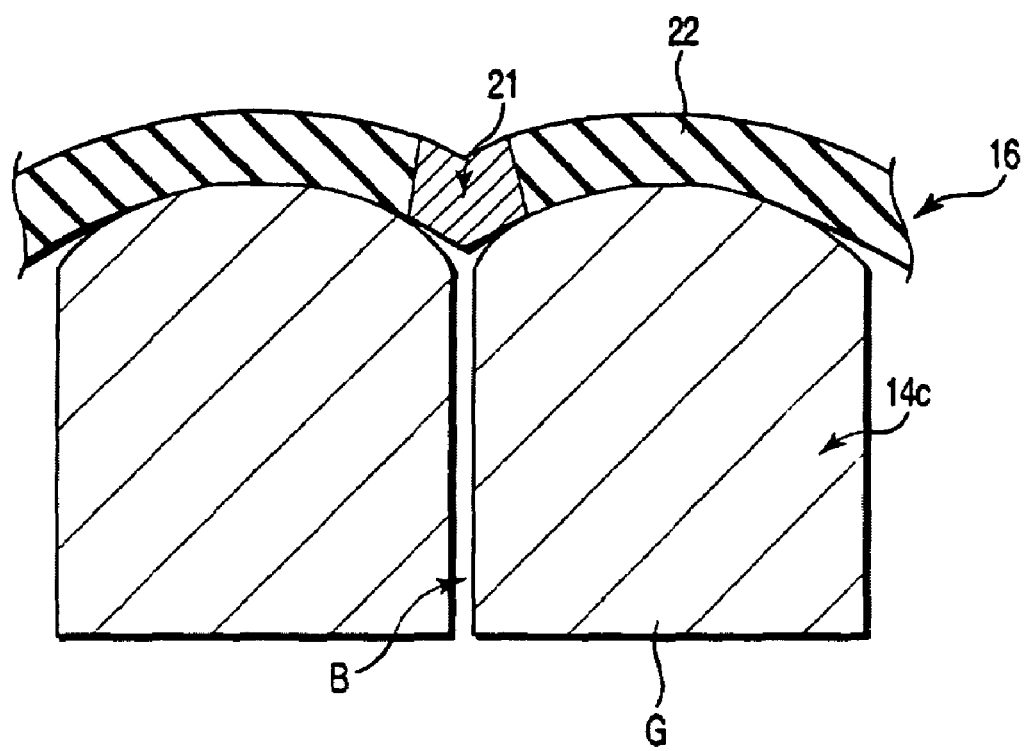
FIG. 12 is a cross-sectional view schematically showing a spacer layer in a magnetoresistive element according to Comparative Example.

FIG. 12 schematically shows such a structure as shown in FIG. 11. As shown in FIG. 12, many current paths (Cu) are located just over the grain boundary B in the underlying magnetic layer. Consequently, a large number of defects are present at the interface between the current path (Cu) and the magnetic layer. This significantly degrades the spin-dependent interface scattering effect. Further, the grain boundary B in the underlying magnetic layer is present immediately below the current path (Cu). Consequently, upon reaching the magnetic layer, electrons having undergone current confining are scattered by the direct effect of the grain boundary. This degrades the spin-dependent bulk scattering effect. As a result, the MR ratio decreases.

When the current path is formed near the grain boundary as shown in FIG. 12, the spin-dependent interface scattering effect at the interface between the current path and the free layer or at the interface between the current path and the pinned layer is lowered, and the spin-dependent bulk scattering effect in the magnetic layer of the free layer is also lowered. In short, the important two phenomena to contribute the MR ratio are lowered together, and thus, a high MR ratio cannot be attained.

In contrast, when the current path is formed on a central portion of a crystal grain near the grain boundaries as shown in FIG. 2, since the interface between the current path and the free layer or the interface between the current path and the pinned layer is good in crystallinity, the spin-dependent interface scattering effect is improved. In addition, since the free layer on the current path grows with good crystallinity, the spin-dependent bulk scattering effect is improved. In short, the important two phenomena to contribute the MR ratio can be improved together, and thus, a high MR ratio can be attained.

Example 2

In the present Example, a magnetoresistive element (CCP-CPP element) having the following structure is manufactured:

lower electrode 11,
underlayer 12: Ta [5 nm]/Ru [2 nm],
pinning layer 13: $Pt_{50}Mn_{50}$ [15 nm],
pinned layer 14: $Co_{90}Fe_{10}$ [4 nm]/Ru [0.9 nm]/($Fe_{50}Co_{50}$ [1 nm]/Cu [0.25 nm])×2/$Fe_{50}Co_{50}$ [1 nm],
lower metal layer 15: Cu [0.5 nm],
spacer layer (CCP-NOL) 16: an $Al_2O_3$ insulating layer 22 and Cu current paths 21 (prepared by depositing $Al_{90}Cu_{10}$ [1 nm], followed by performing PIT and IAO treatments, where the PIT/IAO treatments use similar conditions to those of Example 1),
upper metal layer 17: Cu [0.25 nm],
free layer 18: $Co_{90}Fe_{10}$ [1 nm]/$Ni_{83}Fe_{17}$ [3.5 nm],
cap layer 19: Cu [1 nm]/Ru [10 nm], and
upper electrode 20.

Figure 13A:
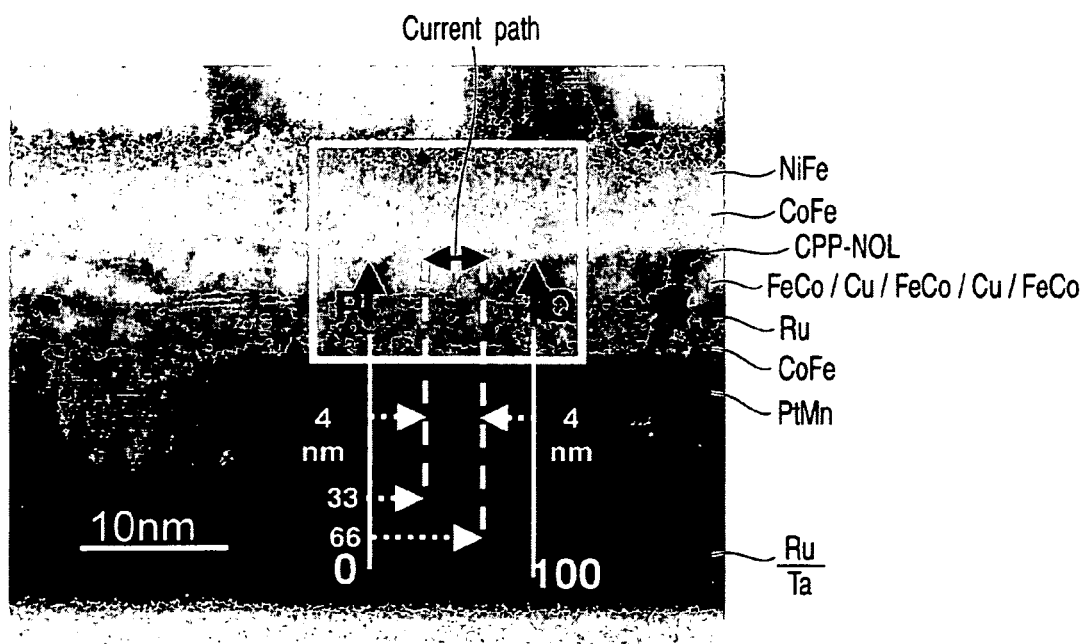
FIGS. 13A and 13B are cross-sectional TEM photographs of a CCP-CPP element according to Example 2.
Figure 13B:
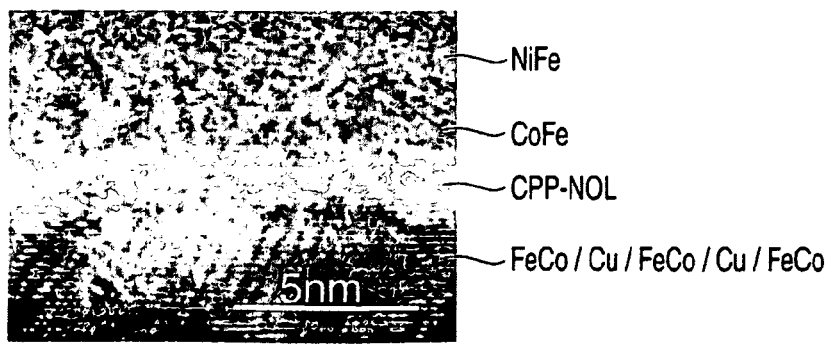

FIGS. 13A and 13B show cross-sectional TEM photographs of the magnetoresistive element (CCP-CPP element) manufactured in the present Example. In FIGS. 13A and 13B, a current path is formed on an almost central portion of the corresponding crystal grain with a size of 10 to 20 nm in the underlying magnetic layer. The diameter of the current path is about 5 nm; it is between 3 and 7 nm if a variation is taken into account. As in the case of Example 1, the current path is formed in the almost central portion of the corresponding crystal grain, so that few crystal defects are present between Cu and the magnetic layer. Consequently, a high spin-dependent interface scattering effect is exerted. Further, a high spin-dependent bulk scattering effect is produced when a current flows through the magnetic layer located immediately below the current path. Therefore, a high MR ratio is likely to be obtained.

FIG. 13A specifically shows the positional relationship between a crystal grain and grain boundaries and a current path, as in the case of FIGS. 7 and 10. In FIG. 13A, the points P and Q correspond to grain boundaries that define one crystal grain. When the points P and Q are defined as the in-plane positions 0 and 100, respectively, a current path with a crystal structure penetrating $Al_2O_3$ with an amorphous structure is formed between the in-plane positions 33 and 66, that is, the current path is formed almost in the center of the crystal grain. The distance between the grain boundary P and the current path is 4 nm; the current path is located away from the grain boundary P. The distance between the other grain boundary Q and the current path is 4 nm; the current path is also located away from the grain boundary Q.

Figure 14B:
FIGS. 14A and 14B show results of nano-diffraction in the CCP-CPP element according to Example 2.
Figure 14A:
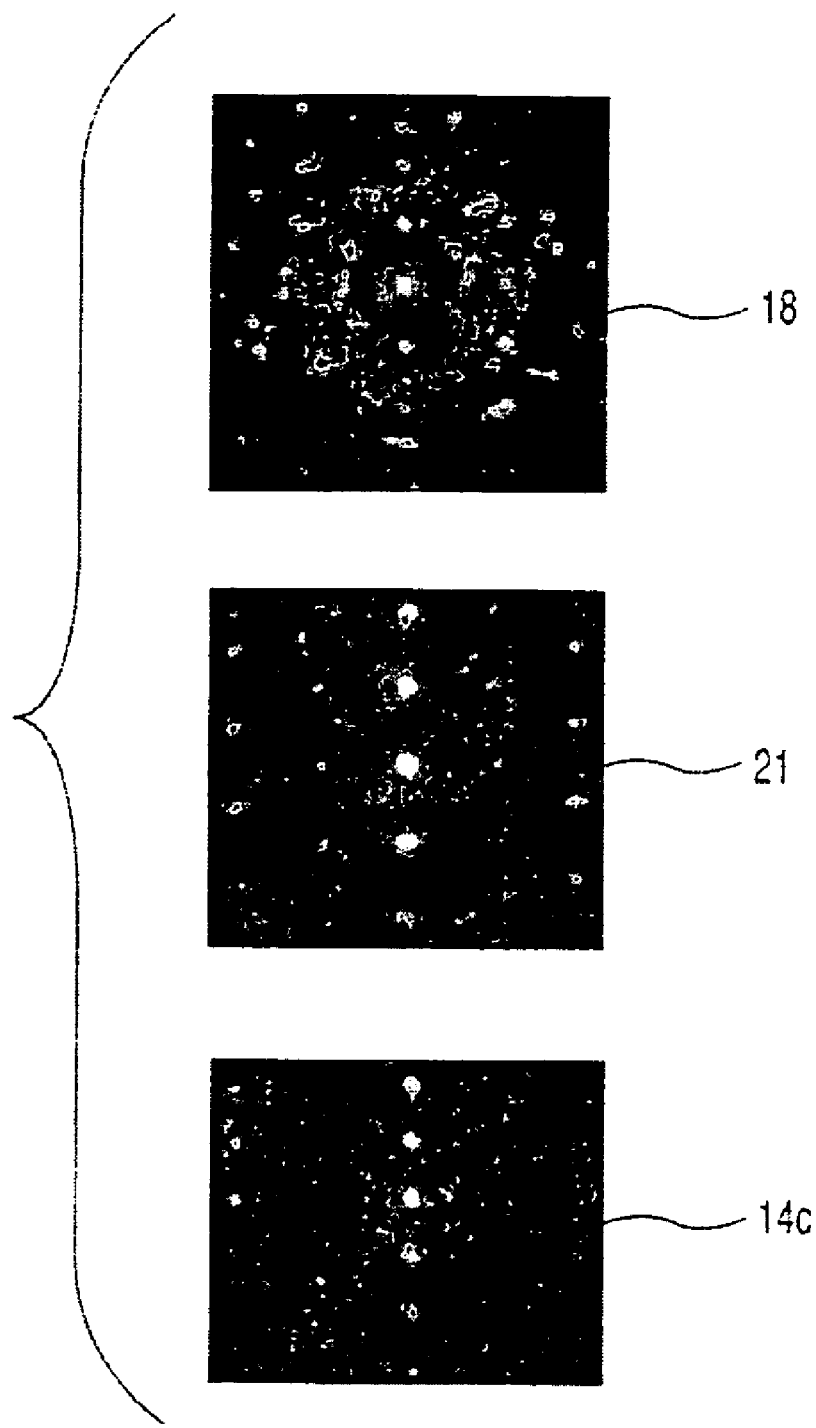

Moreover, FIGS. 14A and 14B show the results of nano diffraction obtained using an electron beam with a spot size of about 0.5 nm in the cross-sectional TEM photograph in FIG. 13. As seen in FIGS. 14A and 14B, the dispersion of crystal orientation angle is within 5° in all of the pinned layer 14c, current paths 21, and free layer 18, which represent good crystal orientations. The crystal orientation of the free layer is slightly inferior to that of the pinned layer, which is due to the formation of the free layer on amorphous alumina. Such a favorable crystal orientation is also achieved in the current path. This lowers the resistivity in the current path to provide a high MR ratio.

With the CCP-CPP element in the present Example, RA=500 Ωμm² and MR ratio=7.3%. The MR ratio is higher than that in Example 1 because $Fe_{50}Co_{50}$ with the bcc structure exerts a higher interface scattering effect than CoFe with the fcc structure. Further, the very thin Cu layer is stacked to enhance the spin-dependent bulk scattering effect in the magnetic layer. This contributes to increasing the MR ratio.

The bottom type CCP-CPP has been described in which the pinned layer is located below the free layer. However, the method according to the embodiment of the present invention is applicable to a top type CCP-CPP element in exactly the same manner. To manufacture a top type CCP-CPP element, the layers between the underlayer 12 and cap layer 19 in FIG. 1 may be deposited in the order reverse to that shown in FIG. 1. Even in the top type CCP-CPP element, the metal layers (Cu layers) over and under the spacer layer provide the same functions as those in the bottom type CCP-CPP element. That is, the Cu layer under the spacer layer is essential because it is a source of the current paths, whereas Cu layer over the spacer layer is not always essential.

(Embodiments of Magnetic Head)

Figure 15:
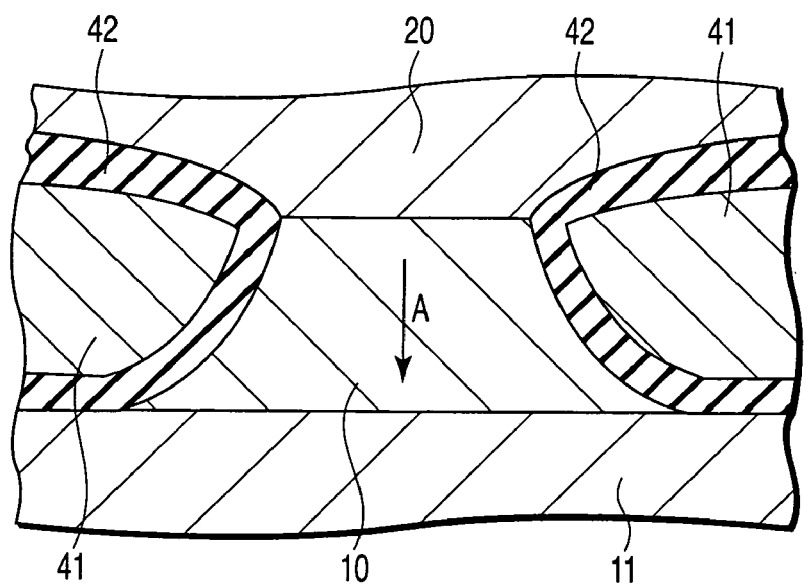
FIG. 15 is a cross-sectional view of a magnetic head according to an embodiment of the present invention.
Figure 16:
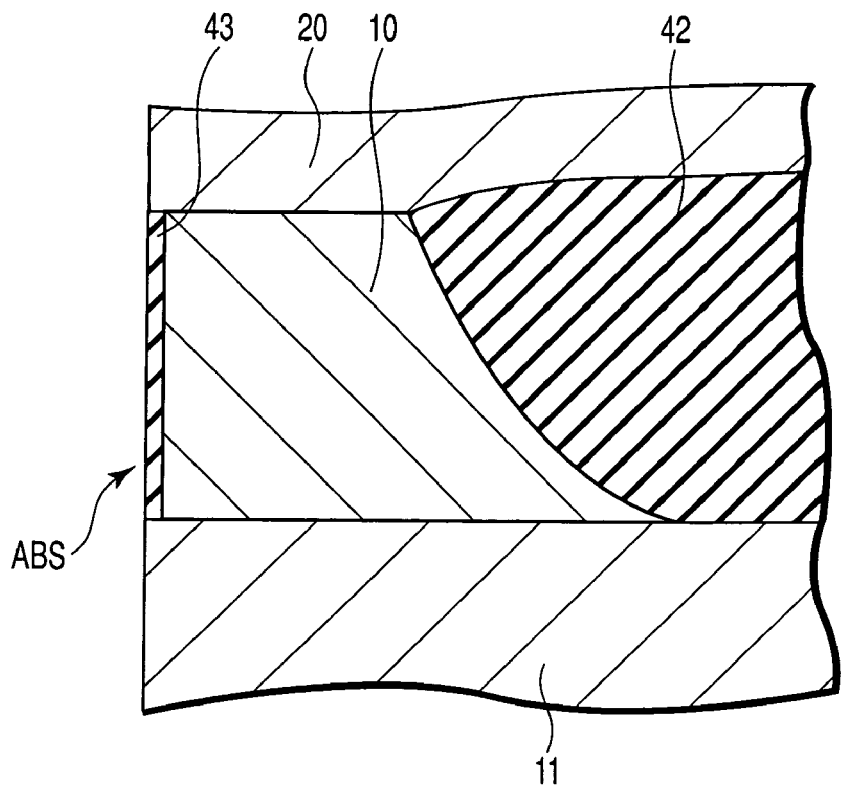
FIG. 16 is a cross-sectional view of a magnetic head according to an embodiment of the present invention.

FIGS. 15 and 16 show the magnetoresistive element according to the embodiment of the present invention which is incorporated in a magnetic head. FIG. 15 is a cross-sectional view of the magnetoresistive element taken along a direction substantially parallel to the air bearing surface facing a magnetic recording media (not shown). FIG. 16 is a cross-sectional view of the magnetoresistive element taken along a direction perpendicular to the air bearing surface (ABS).

The magnetic head shown in FIGS. 15 and 16 have a so-called hard abutted structure. The magnetoresistive film 10 is an aforementioned CCP-CPP film. The lower electrode 11 and the upper electrode 20 are provided under and over the magnetoresistive film 10, respectively. In FIG. 15, bias field application films 41 and insulating films 42 are stacked on the both sides of the magnetoresistive film 10. As shown in FIG. 16, a protective layer 43 is provided in the air bearing surface of the magnetoresistive film 10.

A sense current for the magnetoresistive film 10 is supplied by the electrodes 11 and 20 perpendicularly to the plane as shown by arrow A, the electrodes 11 and 20 being arranged under and over the magnetoresistive film 10. Further, the pair of bias field application films 41, 41, provided on the both sides of the magnetoresistive film 10, applies a bias field to the magnetoresistive film 10. The bias field controls the magnetic anisotropy of the free layer in the magnetoresistive film 10 to make the free layer into a single domain. This stabilizes the domain structure of the free layer. It is thus possible to suppress Barkhausen noise associated with movement of magnetic domain walls.

The present invention improves the MR ratio of the magnetoresistive element. Accordingly, the application of the present invention to a magnetic head enables sensitive magnetic reproduction.

(Embodiments of Hard Disk and Head Gimbal Assembly)

The magnetic head shown in FIGS. 15 and 16 may be incorporated in a read/write integrated magnetic head assembly, which can then be mounted in a magnetic recording apparatus.

Figure 17:
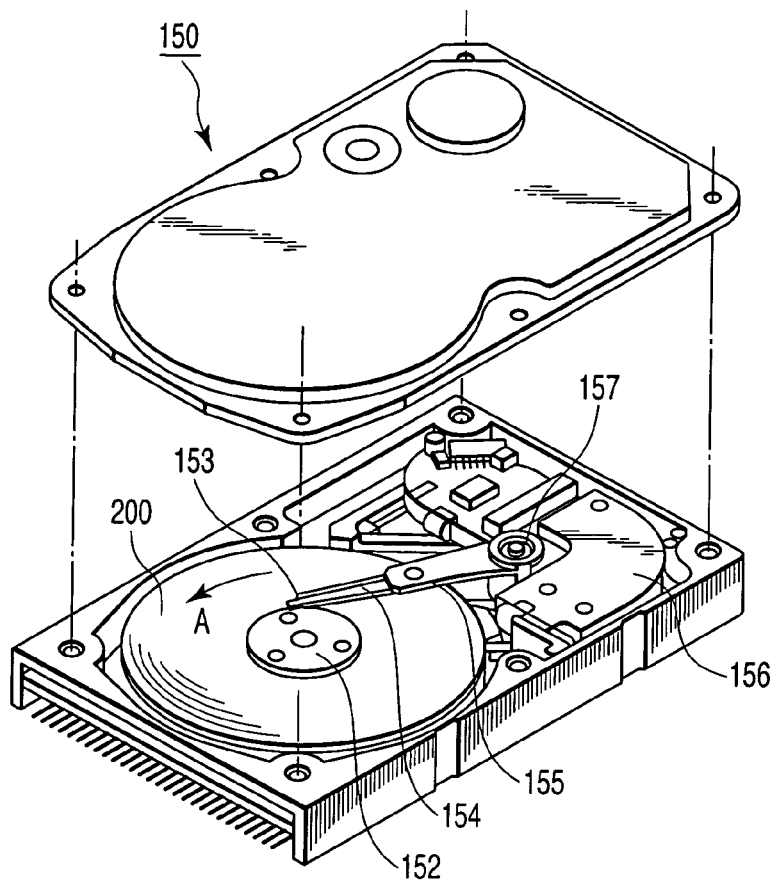
FIG. 17 is a perspective view of a magnetic recording and reproducing apparatus according to an embodiment of the present invention.

FIG. 17 is a perspective view schematically showing the configuration of a major portion of such a magnetic recording apparatus. A magnetic recording apparatus 150 is of a type using a rotary actuator. In this figure, a magnetic disk 200 is installed on a spindle 152. The magnetic disk 200 is rotated in the direction of arrow A by a motor (not shown) that responds to control signals from a drive controller (not shown). The magnetic recording apparatus 150 according to the present invention may comprise a plurality of disks 200.

A head slider 153 is attached to the tip of a suspension 154 to read from and write to the magnetic disk 200. The head slider 153 has a magnetic head mounted near the tip thereof and including the magnetoresistive element according to any of the above embodiments.

When the magnetic disk 200 rotates, the air bearing surface (ABS) of head slider 153 is held so as to float on the surface of the magnetic disk 200 by a predetermined height. The head slider 153 may be of a so-called in-contact type contacting to the magnetic disk 200.

The suspension 154 is connected to one end of an actuator arm 155. A voice coil motor 156, a kind of linear motor, is provided on the other end of the actuator arm 155. The voice coil motor 156 forms a magnetic circuit including a driving coil (not shown) wound around a bobbin and a permanent magnet and a counter yoke arranged opposite each other so as to sandwich the coil therebetween.

The actuator arm 155 is held by ball bearings (not shown) provided at two vertical positions of the pivot 157. The actuator arm 155 can be rotatably slid by the voice coil motor 156.

Figure 18:
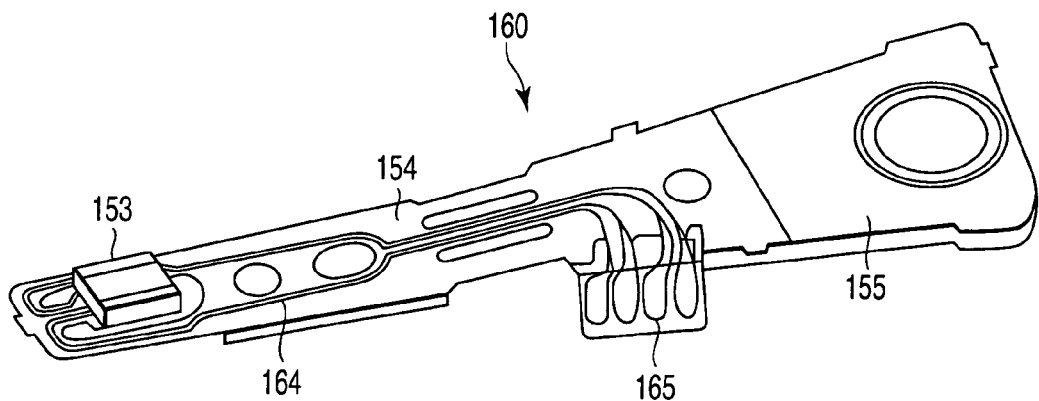
FIG. 18 is a perspective view of a magnetic head assembly according to an embodiment of the present invention.

FIG. 18 is an enlarged perspective view of a part of the head gimbal assembly including tip end side of the actuator arm 155, which is viewed from the disk. The assembly 160 has the actuator arm 155, and the suspension 154 is connected to one end of the actuator arm 155. The head slider 153 is attached to the tip of the suspension 154, and the head slider 153 comprises a magnetic head including the magnetoresistive element according to any of the above embodiments. The suspension 154 has leads 164 used to write and read signals. The leads 164 are electrically connected to respective electrodes in the magnetic head incorporated in the head slider 153. Reference numeral 165 in the figure denotes electrode pads of the assembly 160.

The present invention comprises the magnetic head including the magnetoresistive element according to any of the above embodiments of the present invention. This makes it possible to reliably read information magnetically recorded on the magnetic disk 200 at a recording density higher than that in the prior art.

(Embodiments of Magnetic Memory)

A magnetic memory using the magnetoresistive element according to an embodiment of the present invention will now be described. That is, the magnetoresistive element according to any of the above embodiments of the present invention makes it possible to provide a magnetic memory, for example, a magnetic random access memory (MRAM) in which memory cells are arrayed in a matrix.

FIG. 19 is a diagram showing an example of the matrix configuration of a magnetic memory according to an embodiment of the present invention. This figure shows the circuit configuration in which memory cells are arrayed. The magnetic memory comprises a column decoder 350 and a row decoder 351 to select one bit in the array. A bit line 334 and a word line 332 are used to turn on and uniquely select a switching transistor 330. Detection by a sense amplifier 352 enables reading of the bit information recorded in the magnetic recording layer (free layer) in the magnetoresistive element 10. To write bit information, a current is passed through a particular word line 323 and a particular bit line 322 to generate a magnetic field to be applied.

FIG. 20 is a diagram showing another example of the matrix configuration of a magnetic memory according to an embodiment of the present invention. In this case, one of bit lines 322 is selected by a decoder 361, while one of the word lines 334 is selected by a decoder 360; the bit lines 322 and the word lines 334 are arrayed in a matrix. Thus, a particular memory cell in the array is selected. Each memory cell has a structure in which the magnetoresistive element 10 and a diode D are connected in series. Here, the diode D serves to prevent a sense current from bypassing in the memory cells except the selected magnetoresistive element 10. A write operation is performed by using a magnetic field generated by passing a write current through each of a particular bit line 322 and a particular word line 323.

FIG. 21 is a cross-sectional view showing a major portion of a magnetic memory according to an embodiment of the present invention. FIG. 22 is a cross-sectional view taken along the line A-A' in FIG. 21. The structure shown in these figures corresponds to a memory cell for one bit included in the magnetic memory shown in FIG. 19 or 20. The memory cell has a storage element 311 and an address selecting transistor 312.

The storage element 311 has the magnetoresistive element 10 and a pair of wires 322 and 324 connected to the magnetoresistive element 10. The magnetoresistive element 10 is any CCP-CPP element of the above embodiments.

On the other hand, the selecting transistor 312 is provided with a transistor 330 connected to the magnetoresistive element 10 through vias 326 and buried wires 328. The transistor 330 performs a switching operation in accordance with a voltage applied to a gate 332 to controllably open and close the current paths between the magnetoresistive element 10 and a wire 334.

A write wire 323 is provided below the magnetoresistive element 10 in a direction orthogonal to the wire 322. The write wires 322 and 323 can be formed of, for example, aluminum (Al), copper (Cu), tungsten (W), tantalum (Ta), or an alloy of these elements.

In the memory configured as described above, to write bit information to the magnetoresistive element 10, a write pulse current is passed through the wires 322 and 323 to induce a synthetic field. The synthetic field is applied to appropriately reverse the magnetization of the recording layer of the magnetoresistive element.

Further, to read bit information, a sense current is passed through the wire 322, the magnetoresistive element 10 including the magnetic recording layer, and the lower electrode 324. Then, the resistance value or a resistance change of the magnetoresistive element 10 is measured.

The magnetic memory according to the embodiment of the present invention uses the magnetoresistive element (CCP-CPP element) according to any of the above embodiments. Consequently, even with a reduction in cell size, the magnetic domains in the recording layer are surely controlled to allow write and read operations to be reliably performed.

The embodiments of the present invention have been described with reference to the specific examples. However, the present invention is not limited to these specific examples. For example, for the specific structure of the magnetoresistive element as well as the shapes and materials of the electrodes, bias application film, insulating film, and the like, those skilled in the art can similarly implement the present invention to produce similar effects by making appropriate selections from the corresponding well-known ranges.

For example, when the magnetoresistive element is applied to a read magnetic head, the detection resolution of the magnetic head can be defined by providing magnetic shields on both sides of the element.

Further, the present invention can be applied to a magnetic head or magnetic recording apparatus based on a perpendicular magnetic recording system as well as a longitudinal magnetic recording system, and can produce similar effects in any system.

Moreover, the magnetic recording apparatus according to the present invention may be a so-called a rigid type constantly provided with particular recording media or a removable type that allows recording media to be exchanged.

The scope of the present invention also includes all the magnetoresistive elements, magnetic heads, magnetic recording apparatuses, and magnetic memories that can be implemented by those skilled in the art by appropriately changing the designs of the above magnetic heads and magnetic recording apparatuses described above as the embodiments of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
a magnetization pinned layer a magnetization direction of which is substantially pinned in one direction;

a magnetization free layer a magnetization direction of which varies depending on an external field; and a spacer layer including an insulating layer provided between the magnetization pinned layer and the magnetization free layer and current paths penetrating the insulating layer, the magnetization pinned layer or magnetization free layer located under the spacer layer comprising crystal grains separated by grain boundaries extending across a thickness thereof, wherein, an in-plane position of one end of each of the crystal grains is set to 0, an in-plane position of a grain boundary adjacent to the other end of the crystal grain is set to 100, and the current path corresponding to each crystal grain is formed on a region of the crystal grain in a range between 20 and 80 of the in-plane position.

2. The magnetoresistive element according to claim 1, wherein a crystal lattice is continuously formed between each of the current paths and the magnetization pinned layer or magnetization free layer located under the current path and the magnetization free layer or magnetization pinned layer located over the current path.

3. The magnetoresistive element according to claim 1, wherein each of the current paths contains at least one element selected from the group consisting of Cu, Au and Ag.

4. The magnetoresistive element according to claim 1, wherein the insulating layer is an oxide, a nitride or an oxynitride containing at least one element selected from the group consisting of Al, Si, Hf, Ti, Ta, Mo, W, Nb, Cr, Mg, and Zr.

5. The magnetoresistive element according to claim 1, wherein the magnetization pinned layer constitutes a body-centered cubic structure at an interface with the spacer layer.

6. The magnetoresistive element according to claim 1, wherein the magnetization pinned layer comprises a layer in contact with the spacer layer which is formed of an Fe alloy containing at least 30 atomic % of Fe.

7. The magnetoresistive element according to claim 1, wherein the magnetization pinned layer comprises a stacked film of a ferromagnetic layer and a Cu layer of thickness of 0.1 nm or more and 1 nm or less.

8. A magnetoresistive head comprising the magnetoresistive element according to claim 1.

9. A magnetic recording apparatus comprising the magnetoresistive head according to claim 8.

10. A magnetic memory comprising the magnetoresistive element according to claim 1.

11. A magnetoresistive element comprising:

a magnetization pinned layer a magnetization direction of which is substantially pinned in one direction;

a magnetization free layer a magnetization direction of which varies depending on an external field; and a spacer layer including an insulating layer provided between the magnetization pinned layer and the magnetization free layer and current paths penetrating the insulating layer, the magnetization pinned layer or magnetization free layer located under the spacer layer comprising crystal grains separated by grain boundaries extending across a thickness thereof, wherein each of the current paths is formed on a region at least 3 nm away from ends of each of the crystal grains contained in the magnetization pinned layer or magnetization free layer located under the spacer layer.

12. The magnetoresistive element according to claim 11, wherein a crystal lattice is continuously formed between each of the current paths and the magnetization pinned layer or magnetization free layer located under the current path and the magnetization free layer or magnetization pinned layer located over the current path.

13. The magnetoresistive element according to claim 11, wherein each of the current paths contains at least one element selected from the group consisting of Cu, Au and Ag.

14. The magnetoresistive element according to claim 11, wherein the insulating layer is an oxide or a nitride containing at least one element selected from the group consisting of Al, Si, Hf, Ti, Ta, Mo, W, Nb, Cr, Mg, and Zr.

15. The magnetoresistive element according to claim 11, wherein the magnetization pinned layer constitutes a body-centered cubic structure at an interface with the spacer layer.

16. The magnetoresistive element according to claim 11, wherein the magnetization pinned layer comprises a layer in contact with the spacer layer which is formed of an Fe alloy containing at least 30 atomic % of Fe.

17. The magnetoresistive element according to claim 11, wherein the magnetization pinned layer comprises a stacked film of a ferromagnetic layer and a Cu layer of thickness of 0.1 nm or more and 1 nm or less.

18. A magnetoresistive element comprising:

a magnetization pinned layer a magnetization direction of which is substantially pinned in one direction;

a magnetization free layer a magnetization direction of which varies depending on an external field; and a spacer layer including an insulating layer provided between the magnetization pinned layer and the magnetization free layer and current paths penetrating the insulating layer, wherein dispersion of a crystal orientation angle of each of the current paths is at most 5°.

19. The magnetoresistive element according to claim 18, wherein the dispersion of the crystal orientation angle is at most 5° for all of the magnetization pinned layer, the current paths, and the magnetization free layer.

* * * * *